US012588399B2

(12) United States Patent
Kim et al.

(10) Patent No.: US 12,588,399 B2
(45) Date of Patent: Mar. 24, 2026

(54) DISPLAY DEVICE

(71) Applicant: Samsung Display Co., Ltd., Yongin-si (KR)

(72) Inventors: Jeongki Kim, Yongin-si (KR); Jang-Il Kim, Yongin-si (KR); Jong-Hoon Kim, Yongin-si (KR); Sujin Lee, Yongin-si (KR); Hakbum Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 392 days.

(21) Appl. No.: 18/126,754

(22) Filed: Mar. 27, 2023

(65) Prior Publication Data

US 2024/0040917 A1      Feb. 1, 2024

(30) Foreign Application Priority Data

Aug. 1, 2022     (KR) ........................ 10-2022-0095486

(51) Int. Cl.
| | |
|---|---|
| *H10K 59/80* | (2023.01) |
| *H10K 59/12* | (2023.01) |
| *H10K 59/38* | (2023.01) |
| *H10K 59/88* | (2023.01) |

(52) U.S. Cl.
CPC ......... *H10K 59/8792* (2023.02); *H10K 59/38* (2023.02); *H10K 59/88* (2023.02); *H10K 59/12* (2023.02)

(58) Field of Classification Search
CPC .... H10K 59/8792; H10K 59/88; H10K 59/38; H10K 59/12
See application file for complete search history.

(56) References Cited

U.S. PATENT DOCUMENTS

| | | | |
|---|---|---|---|
| 10,216,037 | B2 | 2/2019 | Kim et al. |
| 10,725,333 | B2 * | 7/2020 | Kim .................. G02F 1/136286 |
| 10,916,722 | B2 | 2/2021 | Park et al. |
| 12,457,875 | B2 | 10/2025 | Lee et al. |
| 2020/0258944 | A1 * | 8/2020 | Joo ..................... H10K 59/8792 |
| 2021/0384271 | A1 * | 12/2021 | Ahn ........................ H10K 71/70 |
| 2022/0231200 | A1 * | 7/2022 | Kim ........................ H10K 59/38 |

(Continued)

FOREIGN PATENT DOCUMENTS

| | | |
|---|---|---|
| KR | 1020180066936 A | 6/2018 |
| KR | 102062587 B1 | 1/2020 |

(Continued)

*Primary Examiner* — Mary Ellen Bowman
(74) *Attorney, Agent, or Firm* — CANTOR COLBURN LLP

(57) ABSTRACT

A display device includes light emitting elements, each of which emits a source light, a color filter layer including first to third pixel areas arranged in a first direction and a light blocking area surrounding the first to third pixel areas, a light control pattern overlapping the second pixel area, where a first opening overlapping the first pixel area and a portion of the light blocking area and a second opening overlapping the third pixel area and another portion of the light blocking area are defined through the light control pattern, a first light conversion pattern disposed in the first opening and including a first quantum dot, and a second light conversion pattern disposed in the second opening and including a second quantum dot.

30 Claims, 22 Drawing Sheets

(56)         References Cited

U.S. PATENT DOCUMENTS

2023/0263008 A1* 8/2023 Lee ........................ H10K 71/00
                                                      257/91
2024/0049552 A1    2/2024 Kim et al.
2024/0341141 A1* 10/2024 Bang ................... H10K 59/126

FOREIGN PATENT DOCUMENTS

KR      1020200032294 A      3/2020
KR      1020210151302 A     12/2021
KR      1020220088545 A      6/2022
KR      1020220105244 A      7/2022

* cited by examiner

Figure 6A:
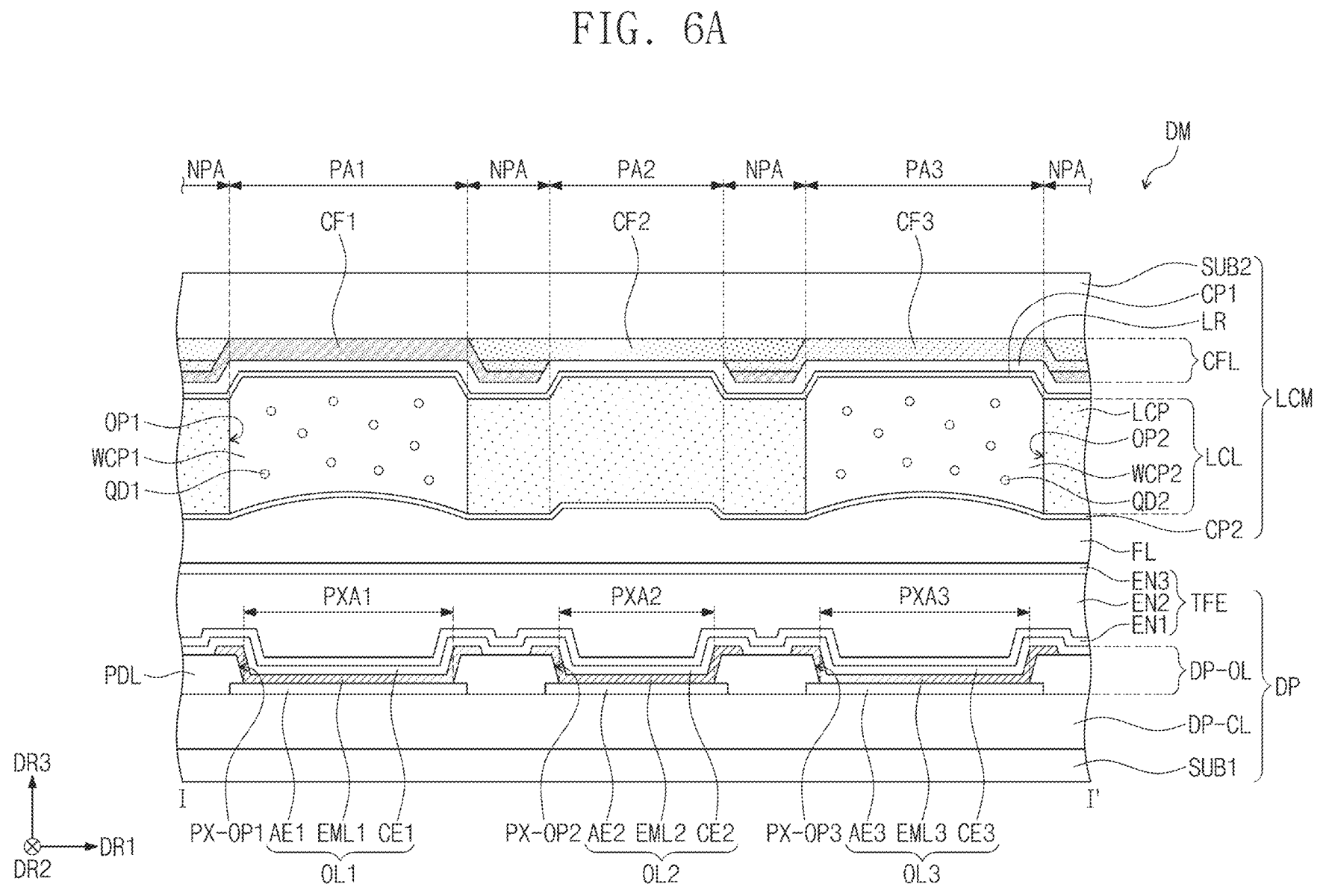

LCM

SUB2
CP1
LR
CFL
LCP
OP2
WCP2
QD2
LCL
CP2

DP

TFE
EN3
EN2
EN1
FL

DP-OL
DP-CL
SUB1

NPA  PA3  NPA  PA2  NPA  PA1  NPA

CF3
CF2
CF1

PXA3  PXA2  PXA1

T'

PX-OP3 AE3 EML3 CE3
OL3

PX-OP2 AE2 EML2 CE2
OL2

PX-OP1 AE1 EML1 CE1
OL1

T

OP1
WCP1
QD1

PDL

LCM-1

NPA | PA3 | NPA | PA2 | NPA | PA1 | NPA

CP1
LR
CFL
SUB2

LCP
CP1
LR
CFL
SUB2
LCM-1

PA3 | NPA | PA2 | NPA | PA1 | NPA

DISPLAY DEVICE

This application claims to Korean Patent Application No. 10-2022-0095486, filed on Aug. 1, 2022, and all the benefits accruing therefrom priority under 35 U.S.C. § 119, the content of which in its entirety is herein incorporated by reference.

BACKGROUND

1. Field

The disclosure relates to a display device. More particularly, the disclosure relates to a display device with improved visibility.

2. Description of the Related Art

Multimedia devices, such as televisions, mobile phones, tablet computers, computers, navigation devices, and game devices, include a display panel for displaying an image. The display panel typically includes pixels for generating the image, and each of the pixels includes a light emitting element for emitting a light and a circuit element connected to the light emitting element.

The display device may provide one type of source light using the light emitting element, and the source light may be converted by a separate light conversion member including quantum dots to provide multi-colored lights.

SUMMARY

In a display device including a light conversion member including quantum dots, the light conversion member including the quantum dots may be provided by an inkjet process. In this case, a display quality of the display device may be deteriorated due to defects occurring during the inkjet process, and it may be desired to prevent defects occurring during the inkjet process.

The disclosure provides a display device capable of preventing a color sticking-out phenomenon from occurring and having improved visibility.

The disclosure provides a display device with improved process reliability.

The disclosure provides a display device with improved light emission efficiency.

Embodiments of the invention provide a display device including a base layer, light emitting elements disposed on the base layer, where each of the light emitting elements emits a source light, a color filter layer including first, second, and third pixel areas respectively corresponding to the light emitting elements and arranged in a first direction, and a light blocking area surrounding the first, second, and third pixel areas, a light control pattern overlapping the second pixel area, where a first opening is defined through the light control pattern to overlap the first pixel area and a portion of the light blocking area and a second opening is defined through the light control pattern to overlap the third pixel area and another portion of the light blocking area, a first light conversion pattern disposed in the first opening, where the first light conversion pattern includes a first quantum dot, and a second light conversion pattern disposed in the second opening, where second light conversion pattern includes a second quantum dot. In such embodiments, the first light conversion pattern includes a first portion overlapping the first pixel area and a second portion overlapping the portion of the light blocking area and protruding from the first portion when viewed in a plan view. In such embodiments, the second light conversion pattern includes a third portion overlapping the third pixel area and a fourth portion overlapping the another portion of the light blocking area and protruding from the third portion when viewed in the plan view.

In an embodiment, the second portion may have a width greater than a width of the first portion in the first direction.

In an embodiment, the fourth portion may have a width greater than a width of the third portion in the first direction.

In an embodiment, a minimum separation distance between the second portion and the fourth portion may be smaller than a minimum separation distance between the first portion and the third portion when viewed in the plan view.

In an embodiment, the second portion may protrude from the first portion in a second direction substantially perpendicular to the first direction, and the fourth portion may protrude from the third portion in the second direction.

In an embodiment, the second portion may include a first sub-portion extending from the first portion in the second direction and a second sub-portion extending from the first sub-portion in the first direction.

In an embodiment, the fourth portion may include a third sub-portion extending from the third portion in the second direction and a fourth sub-portion extending from the third sub-portion in a direction opposite to the first direction and facing the second sub-portion in the first direction.

In an embodiment, the second portion may further include a third sub-portion extending from the first portion in a direction opposite to the second direction.

In an embodiment, the fourth portion may include a fourth sub-portion extending from the third portion in the direction opposite to the second direction, a fifth sub-portion extending from the fourth sub-portion in a direction opposite to the first direction and facing the third sub-portion in the first direction, and a sixth sub-portion extending from the third portion in the second direction and facing the second sub-portion in the first direction.

In an embodiment, the first and second light conversion patterns may have a shape which is symmetrical with respect to one of a center line of the second pixel area or a center of gravity of the second pixel area when viewed in the plan view.

In an embodiment, the light control pattern may include a photosensitive resin.

In an embodiment, the light control pattern may transmit the source light.

In an embodiment, the color filter layer may include first, second, and third color filters, only the first color filter may be disposed in the first pixel area, only the second color filter may be disposed in the second pixel area, and only the third color filter may be disposed in the third pixel area.

In an embodiment, at least two color filters among the first, second, and third color filters may be stacked in the light blocking area.

In an embodiment, the color filter layer may further include a light blocking pattern overlapping the light blocking area and including a light blocking material.

In an embodiment, each of the first pixel area, the second pixel area, and the third pixel area may be provided in plural, first, second, and third pixel areas may be alternately arranged in the first direction, each of the first light conversion pattern and the second light conversion pattern may be provided in plural, first light conversion patterns may respectively correspond to the first pixel areas, second light conversion patterns may respectively correspond to the third pixel areas, and the first light conversion patterns may be alternately arranged with the second light conversion patterns in the first direction.

In an embodiment, the display device may further include a first dummy light conversion pattern spaced apart from the first and second light conversion patterns in the first direction, where the first dummy light conversion pattern may include the first quantum dot, and a second dummy light conversion pattern disposed between the first dummy light conversion pattern and the first light conversion patterns, where the second dummy light conversion pattern may include the second quantum dot. In such an embodiment, the color filter layer may further include a dummy pixel area spaced apart from the first, second, and third pixel areas in the first direction, and surrounded by the light blocking area, wherein the dummy pixel area may emit a light having substantially a same color as a light emitted from the third pixel area, and the first dummy light conversion pattern may overlap the light blocking area.

In an embodiment, the second dummy light conversion pattern may include a first dummy portion overlapping the dummy pixel area and a second dummy portion overlapping the light blocking area and protruding from the first dummy portion when viewed in the plan view.

In an embodiment, the display device may further include a dummy light emitting element overlapping the second dummy light conversion pattern, and the first dummy light conversion pattern may not overlap the light emitting elements and the dummy light emitting element.

In an embodiment, the first dummy light conversion pattern may have substantially a same shape as the first light conversion pattern when viewed in the plan view, and the second dummy light conversion pattern may have substantially a same shape as the second light conversion pattern when viewed in the plan view.

In an embodiment, each of the first pixel areas, the second pixel areas, and the third pixel areas may be arranged in the second direction.

In an embodiment, the display device may further include an encapsulation layer covering the light emitting elements, a base substrate disposed on the color filter layer, and a filling member disposed between the encapsulation layer and the light control pattern.

In an embodiment, the display device may further include a low refractive index layer disposed between the light control pattern and the color filter layer, a first capping layer disposed between the filling member and the light control pattern, and a second capping layer disposed between the light control pattern and the low refractive index layer.

In an embodiment, the display device may further include an encapsulation layer covering the light emitting elements, and the light control pattern may be disposed directly on the encapsulation layer.

In an embodiment, the display device may further include a low refractive index layer disposed between the light control pattern and the color filter layer, a first capping layer disposed between the light control pattern and the low refractive index layer, and a second capping layer disposed between the low refractive index layer and the color filter layer.

In an embodiment, a width in the first direction of the first opening may be equal to or greater than a width in the first direction of the first pixel area when viewed in a cross-section.

In an embodiment, the first quantum dot may convert the source light into a first color light, the second quantum dot may convert the source light into a second color light, the source light may have a wavelength shorter than a wavelength of the first color light and a wavelength of the second color light, and the wavelength of the first color light may be different from the wavelength of the second color light.

In an embodiment, the light control pattern may overlap a portion of the light blocking area except for the portion of the light blocking area and the another portion of the light blocking area.

Embodiments of the invention provide a display device including light emitting elements, where each of the light emitting elements emits a source light, a color filter layer including first, second, and third pixel areas respectively corresponding to the light emitting elements and arranged in a first direction, and a light blocking area surrounding the first, second, and third pixel areas, a light control pattern overlapping the second pixel area, where a first opening is defined through the light control pattern to overlap the first pixel area and a portion of the light blocking area adjacent to the first pixel area, and a second opening is defined through the light control pattern to overlap the third pixel area and a portion of the light blocking area adjacent to the third pixel area, a first light conversion pattern disposed in the first opening, where the first light conversion pattern includes a first quantum dot, and a second light conversion pattern disposed in the second opening, where second light conversion pattern includes a second quantum dot. In such embodiments, the second pixel area overlaps at least one selected from the portion of the light blocking area adjacent to the first pixel area and the portion of the light blocking area adjacent to the second pixel area in a second direction perpendicular to the first direction.

In an embodiment, the light control pattern may include a photosensitive resin.

According to embodiments of the invention, the pixel areas are arranged in a way to prevent a color sticking-out phenomenon, and thus, the visibility of the display device is improved.

According to embodiments of the invention, an impact margin area with respect to an ink is provided relatively large when performing an inkjet process to manufacture a component of a light control member, and thus, the process reliability of the display device is improved.

According to embodiments of the invention, a light emission area becomes wider while maintaining the process reliability with respect to the inkjet process, and thus, the light emission efficiency of the display device is improved.

BRIEF DESCRIPTION OF THE DRAWINGS

The above and other features of embodiments of the disclosure will become readily apparent by reference to the following detailed description when considered in conjunction with the accompanying drawings, in which:

FIGS. 5A and 5B are enlarged plan views of a display panel according to an embodiment of the disclosure;

FIG. 6A is a cross-sectional view of a display module taken along line I-I' of FIG. 5B;

FIG. 6B is a cross-sectional view of a display module taken along line II-II' of FIG. 5B;

FIG. 6C is a cross-sectional view of a display module taken along line III-III' of FIG. 5B;

FIGS. 7A to 7G are cross-sectional views of a method of manufacturing a light control member according to an embodiment of the disclosure;

FIG. 11 is a cross-sectional view of a display module according to an embodiment of the disclosure; and FIG. 12 is a cross-sectional view of a display module according to an embodiment of the disclosure.

DETAILED DESCRIPTION

Figure 1:
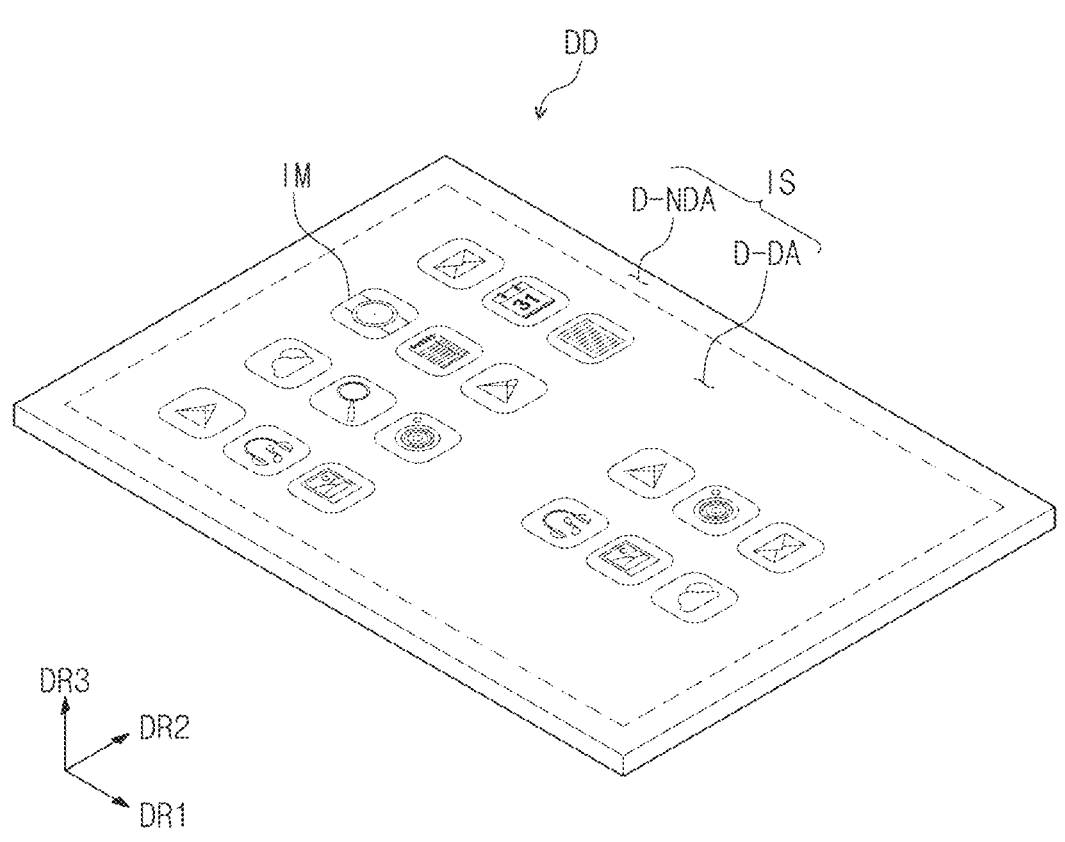
FIG. 1 is a perspective view of a display device according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. "Or" means "and/or." As used herein, the term "and/or" may include any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the disclosure. As used herein, the singular forms, "a", "an" and "the" are intended to include the plural forms as well, unless the context clearly indicates otherwise. "At least one" is not to be construed as limiting "a" or "an."

Spatially relative terms, such as "beneath", "below", "lower", "above", "upper" and the like, may be used herein for ease of description to describe one element or feature's relationship to another elements or features as shown in the figures.

It will be further understood that the terms "comprises" and/or "comprising," or "include" and/or "including", when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the accompanying drawings.

Figure 2:
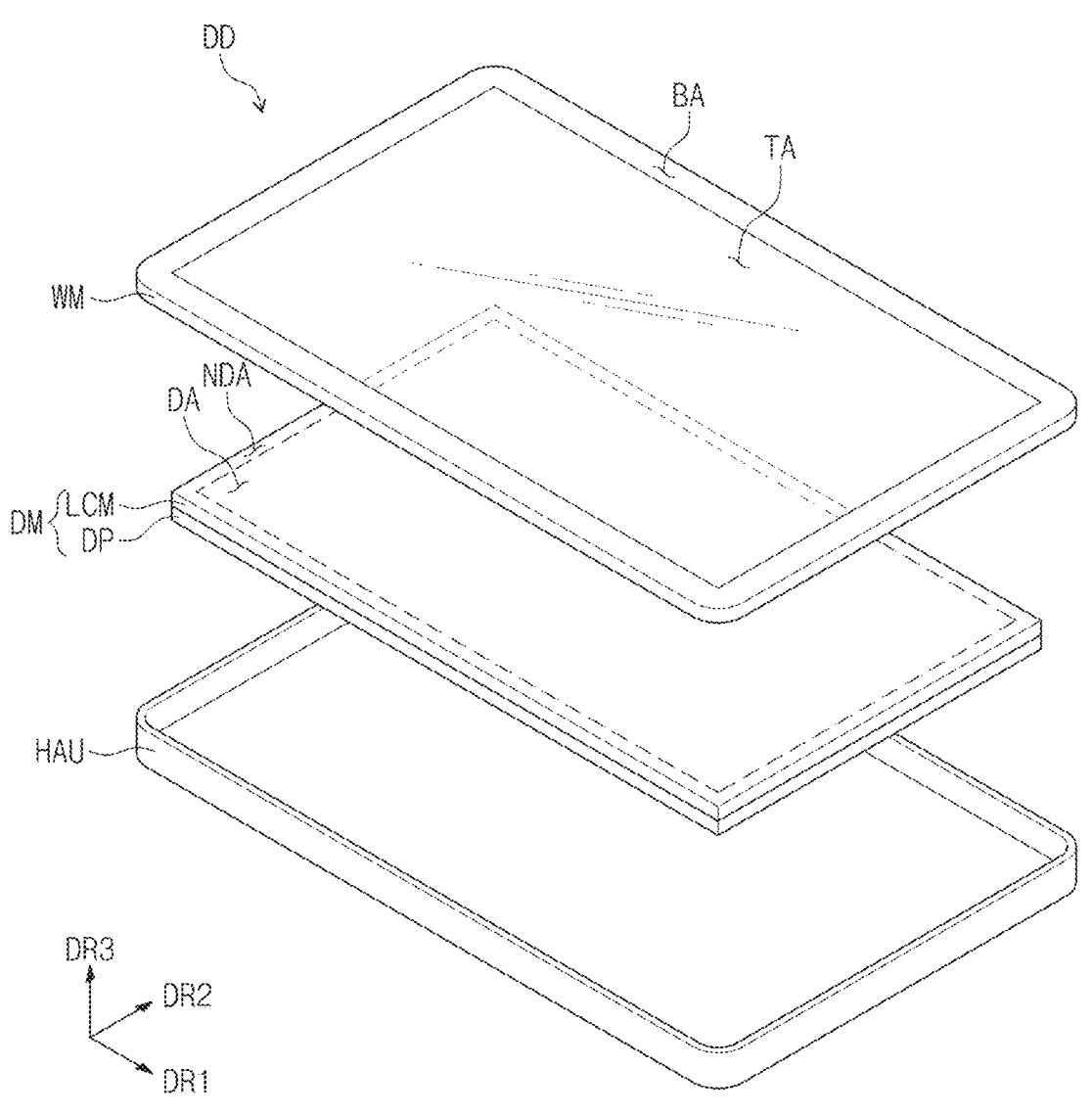
FIG. 2 is an exploded perspective view of a display device according to an embodiment of the disclosure.

FIG. 1 is a perspective view of a display device DD according to an embodiment of the disclosure. FIG. 2 is an exploded perspective view of the display device DD according to an embodiment of the disclosure.

In an embodiment, the display device DD may be activated in response to electrical signals and may display an image. In such an embodiment, the display device DD may include various types of display device to provide the image to a user. In an embodiment, for example, the display device DD may be applied to a large-sized electronic device, such as a television set, an outdoor billboard, etc., and a small and medium-sized electronic device, such as a monitor, a mobile phone, a tablet computer, a computer, a navigation unit, a game unit, etc. However, these are merely examples, and the display device DD may be applied to other electronic devices as long as they do not depart from the concept of the disclosure.

Referring to FIG. 1, in an embodiment, the display device DD may have a rectangular shape with long sides extending in a first direction DR1 and short sides extending in a second direction DR2 crossing the first direction DR1. However, the shape of the display device DD should not be limited to the rectangular shape, and the display device DD may have a variety of shapes, such as a circular shape, a polygonal shape, etc.

The display device DD may display an image IM through a display surface IS toward a third direction DR3, which is substantially perpendicular to a plane defined by the first direction DR1 and the second direction DR2. A normal line direction of the display surface IS may be substantially parallel to the third direction DR3. The display surface IS through which the image IM is displayed may correspond to a front surface of the display device DD. The image IM may include a still image as well as a video. FIG. 1 shows application icons as a representative example of the image IM.

In an embodiment, front (or upper) and rear (or lower) surfaces of each member or each unit of the display device DD may be defined with respect to a direction in which the image IM is displayed. The front and rear surfaces may be opposite to each other in the third direction DR3, and a normal line direction of each of the front and lower surfaces may be substantially parallel to the third direction DR3. A separation distance between the front and rear surfaces of each member (or each unit) in the third direction DR3 may correspond to a thickness of the member (or the unit) in the third direction DR3, that is, the third direction DR3 may be a thickness direction of the display device DD.

In the disclosure, the expression "when viewed in a plan view" or "when viewed on a plane" may mean a state of being viewed in the third direction DR3. In the disclosure, the expression "when viewed in a cross-section" may mean a state of being viewed in the first direction DR1 or the second direction DR2. Meanwhile, directions indicated by the first, second, and third directions DR1, DR2, and DR3 are relative to each other, and thus, the directions indicated by the first, second, and third directions DR1, DR2, and DR3 may be changed to other directions.

The display surface IS of the display device DD may include a display part D-DA and a non-display part D-NDA. The display part D-DA may be a part where the image IM is displayed within the front surface of the display device DD, and a user may view the image IM through the display part D-DA. In FIG. 1, an embodiment of the display part D-DA having a quadrangular shape in a plan view is illustrated as a representative example, however, the display part D-DA may have a variety of shapes depending on a design of the display device DD.

The non-display part D-NDA may be a part where the image IM is not displayed within the front surface of the display device DD. The non-display part D-NDA may have a predetermined color and may block a light. The non-display part D-NDA may be disposed adjacent to the display part D-DA. In an embodiment, for example, the non-display part D-NDA may be disposed outside of the display part D-DA and may surround the display part D-DA, however, this is merely an example. Alternatively, the non-display part D-NDA may be defined adjacent to only one side of the display part D-DA or may be defined in a side surface rather than the front surface of the display device DD. According to an alternative embodiment, the non-display part D-NDA may be omitted.

FIG. 1 shows an embodiment of the display device DD including a flat display surface IS as a representative example. However, the shape of the display surface IS of the display device DD should not be limited thereto or thereby, and the display surface IS may have a curved or three-dimensional shape.

The display device DD may be flexible. The term "flexible" used herein refers to the property of being able to be bent from a structure that is completely bent to a structure that is bent at the scale of a few nanometers. In an embodiment, for example, the display device DD may be a curved display device or a foldable display device. According to an alternative embodiment, the display device DD may be rigid.

According to an embodiment, the display device DD may sense an external input applied thereto from the outside. The external input may include a variety of external inputs provided from the outside, such as pressure, temperature, light, etc. The external input may include a proximity input (e.g., a hovering input) applied when approaching close to or adjacent to the display device DD at a predetermined distance as well as a touch input, e.g., a touch by a hand of a user or a pen.

Referring to FIG. 2, in an embodiment, the display device DD may include a window WM, a display module DM, and an external case HAU. The display module DM may include a display panel DP and a light control member LCM disposed on the display panel DP.

The window WM may be coupled with the external case HAU which forms an external appearance of the display device DD and provides an inner space in which components, e.g., the display module DM, of the display device DD are accommodated.

The window WM may be disposed on the display module DM. The window WM may protect the display module DM from external impacts. A front surface of the window WM may correspond to the display surface IS (refer to FIG. 1) of the display device DD. The front surface of the window WM may include a transmission area TA and a bezel area BA.

The transmission area TA of the window WM may be an optically transparent area. The window WM may transmit the image IM provided from the display module DM through the transmission area TA, and the user may view the image IM. The transmission area TA of the window WM may correspond to the display part D-DA (refer to FIG. 1) of the display device DD.

The window WM may include an optically transparent insulating material. In an embodiment, for example, the window WM may include a glass, sapphire, or plastic material. The window WM may have a single-layer or multi-layer structure. The window WM may further include functional layers, such as an anti-fingerprint layer, a phase control layer, a hard coating layer, etc., disposed on an optically transparent substrate.

The bezel area BA of the window WM may be obtained by depositing, coating, or printing a material having a predetermined color on a transparent substrate. The bezel area BA of the window WM may prevent components of the display module DM, which are disposed to overlap the bezel area BA, from being viewed from the outside. The bezel area BA may correspond to the non-display part D-NDA (refer to FIG. 1) of the display device DD.

The display module DM may be disposed between the window WM and the external case HAU. The display module DM may display the image IM in response to electrical signals. The display module DM may include a display area DA and a non-display area NDA defined adjacent to the display area DA.

The display area DA may be activated in response to electrical signals. The display area DA may be an area from which the image IM provided from the display panel DP exits. The display area DA of the display module DM may overlap at least a portion of the transmission area TA. The image IM exiting from the display area DA may be viewed from the outside through the transmission area TA.

The non-display area NDA may be defined adjacent to the display area DA. In an embodiment, for example, the non-display area NDA may surround the display area DA, however, it should not be limited thereto or thereby. According to an embodiment, the non-display area NDA may be defined in a variety of shapes. A driving circuit or a driving line to drive elements disposed in the display area DA, various signal lines to provide electrical signals to the elements, and pads may be disposed in the non-display area NDA. The non-display area NDA of the display module DM may overlap at least a portion of the bezel area BA. Components of the display module DM, which are disposed in the non-display area NDA, may be prevented from being viewed from the outside due to the bezel area BA.

The display panel DP according to an embodiment may be a light-emitting type display panel, however, it should not be particularly limited. In an embodiment, for example, the display panel DP may be an organic light emitting display panel, an inorganic light emitting display panel, or a quantum dot light emitting display panel. A light emitting layer of the organic light emitting display panel may include an organic light emitting material. A light emitting layer of the inorganic light emitting display panel may include an inorganic light emitting material. A light emitting layer of the quantum dot light emitting display panel may include a quantum dot and/or a quantum rod. Hereinafter, embodiments where the display panel DP is the organic light emitting display panel will be described in detail for convenience of description.

The light control member LCM may be disposed on the display panel DP. In an embodiment, the light control member LCM may be coupled to the display panel DP by a coupling process after being manufactured through a separate process and provided on the display panel DP. According to an alternative embodiment, the light control member LCM may be formed on the display panel DP through successive processes.

The light control member LCM may selectively transmit a light provided from the display panel DP or may selectively convert a wavelength of the light provided from the display panel DP. In addition, the light control member LCM may prevent the light, which is incident into the display device DD from the outside of the display device DD, from being reflected.

The external case HAU may be disposed under the display module DM and may accommodate the display module DM. The external case HAU may include a material with a relatively high strength. The external case HAU may absorb impacts applied thereto from the outside and may prevent a foreign substance and moisture from entering the display module DM, and thus, the display module DM may be protected by the external case HAU. According to an embodiment, the external case HAU may be provided in a form obtained by coupling a plurality of accommodating members.

In an embodiment, the display device DD may further include an input sensing module that obtains coordinate information of the external input applied thereto from the outside of the display device DD. The input sensing module of the display device DD may be driven in various ways, such as a capacitive method, a resistive method, an infrared ray method, a pressure method, or the like, however, it should not be particularly limited.

The input sensing module may be disposed on the display module DM. The input sensing module may be disposed directly on the display module DM through successive processes or may be attached to the display module DM by an adhesive layer after being manufactured separately from the display module DM. The input sensing module may be disposed between components of the display module DM. In an embodiment, for example, the input sensing module may be disposed between the display panel DP and the light control member LCM.

Figure 3:
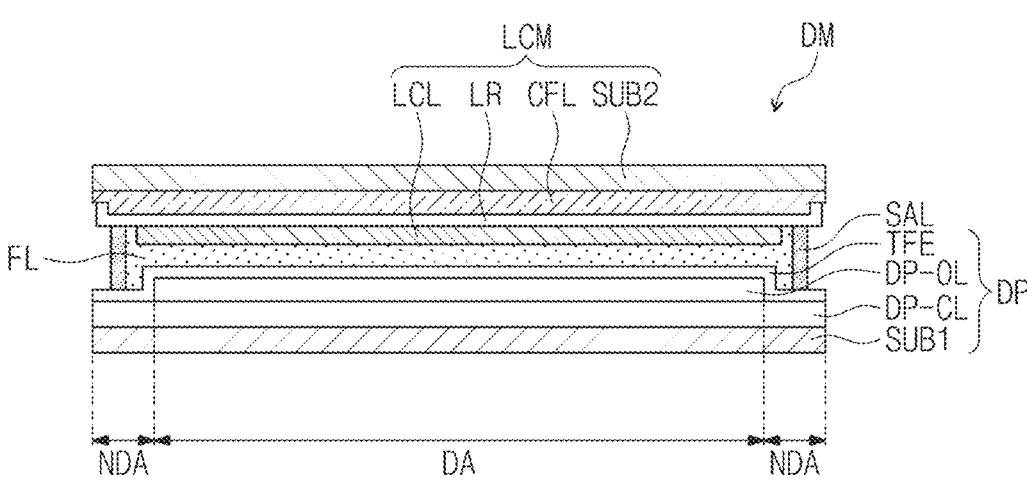
FIG. 3 is a cross-sectional view of a display module according to an embodiment of the disclosure.
Figure 3:
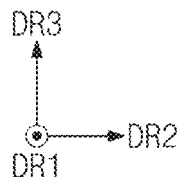

FIG. 3 is a cross-sectional view of the display module DM according to an embodiment of the disclosure.

Referring to FIG. 3, in an embodiment, the display module DM may include the display panel DP, the light control member LCM, a sealing member SAL and a filling member FL. The sealing member SAL and the filling member FL may be disposed between the display panel DP and the light control member LCM. The display module DM may be manufactured by coupling the display panel DP to the light control member LCM formed through a separate process from the display panel DP.

The display panel DP may include a base layer SUB1, a circuit layer DP-CL, a display element layer DP-OL, and an encapsulation layer TFE.

The base layer SUB1 may include the display area DA and the non-display area NDA and may provide a base surface on which components of the display panel DP are stacked. The base layer SUB1 may include an upper surface and a lower surface, which are substantially parallel to each of the first direction DR1 and the second direction DR2. The circuit layer DP-CL, the display element layer DP-OL, and the encapsulation layer TFE may be sequentially stacked on the upper surface of the base layer SUB1 in the third direction DR3.

The display element layer DP-OL may include light emitting elements disposed in the display area DA. The circuit layer DP-CL may be disposed between the display element layer DP-OL and the base layer SUB1 and may include driving elements, the signal lines, and the pads, which are connected to the light emitting elements. The light emitting elements of the display element layer DP-OL may provide a source light (or a first color light) to the light control member LCM in the display area DA.

The encapsulation layer TFE may be disposed on the display element layer DP-OL and may encapsulate the light emitting elements. The encapsulation layer TFE may include a plurality of thin films. The thin films of the encapsulation layer TFE may be disposed to improve an optical efficiency of the light emitting element or to protect the light emitting element.

In an embodiment, as shown in FIG. 3, the light control member LCM may include a base substrate SUB2, a color filter layer CFL, a low refractive index layer LR, and a light control layer LCL.

The base substrate SUB2 may provide a base surface on which components of the light control member LCM are stacked. The base substrate SUB2 may include a front surface and a rear surface, which are substantially parallel to each of the first direction DR1 and the second direction DR2. The rear surface of the base substrate SUB2 may face (or be disposed opposite to) the upper surface of the base layer SUB1. The color filter layer CFL, the low refractive index layer LR, and the light control layer LCL may be sequentially stacked on the rear surface of the base substrate SUB2 in the third direction DR3.

The light control layer LCL may include a light control pattern and light conversion patterns. The light control pattern may transmit the source light, and the light conversion patterns may convert a wavelength of the source light provided from the light emitting element.

The color filter layer CFL may include color filters and may filter lights exiting from the light control layer LCL. The color filter layer CFL may prevent a color purity of the display device DD (refer to FIG. 1) from being lowered and may reduce a reflectance of the display device DD (refer to FIG. 1) with respect to the external light.

The sealing member SAL may be disposed between the display panel DP and the light control member LCM, and the display panel DP may be coupled to the light control member LCM by the sealing member SAL. The sealing member SAL may be disposed to overlap the non-display area NDA. The display panel DP and the light control member LCM may be formed through separate processes (or separately through different processes form each other), and the display module DM may be manufactured by coupling the display panel DP to the light control member LCM using the sealing member SAL. The sealing member SAL may include an ultraviolet-ray curable material. However, a material for the sealing member SAL should not be limited thereto or thereby.

The filling member FL may be disposed between the display panel DP and the light control member LCM and may be filled in an empty space between the display panel DP and the light control member LCM in the display area DA. According to an embodiment, the filling member FL may be disposed between the encapsulation layer TFE and the light control layer LCL. The filling member FL may include a silicon, epoxy, or acrylic-based heat curable material, however, a material for the filling member FL should not be limited thereto or thereby.

Figure 4:
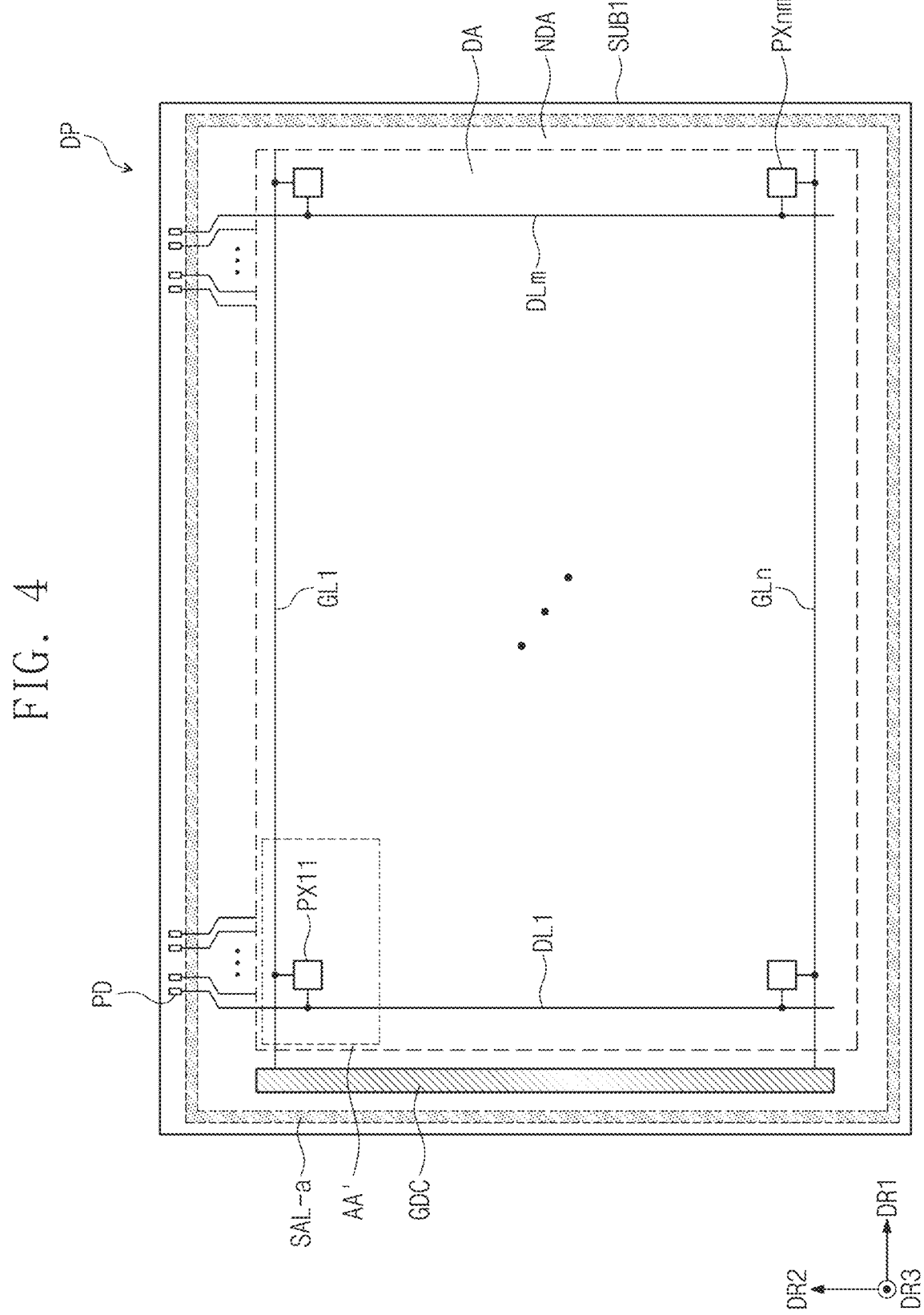
FIG. 4 is a plan view of a display panel according to an embodiment of the disclosure.

FIG. 4 is a plan view of the display panel DP according to an embodiment of the disclosure. FIG. 4 schematically shows components of the display panel DP when viewed in the third direction DR3.

Referring to FIG. 4, in an embodiment, the base layer SUB1 of the display panel DP may include the display area DA and the non-display area NDA. The display panel DP may include pixels PX11 to PXnm, signal lines GL1 to GLn and DL1 to DLm electrically connected to the pixels PX11 to PXnm, a driving circuit GDC, and pads PD.

Each of the pixels PX11 to PXnm may include a pixel driving circuit configured to include the light emitting element and a plurality of transistors, e.g., a switching transistor, a driving transistor, etc., connected to the light emitting element. Each of the pixels PX11 to PXnm may emit a light in response to electrical signals applied thereto.

The pixels PX11 to PXnm may be arranged in the display area DA, however, they should not be limited thereto or thereby. According to some of the pixels PX11 to PXnm, the transistors forming the pixel may be arranged in the non-display area NDA. FIG. 4 shows an embodiment where the pixels PX11 to PXnm are arranged in a matrix form, however, the arrangement of the pixels PX11 to PXnm should not be limited thereto or thereby.

The signal lines GL1 to GLn and DL1 to DLm may include gate lines GL1 to GLn and data lines DL1 to DLm. Each of the pixels PX11 to PXnm may be connected to a corresponding gate line of the gate lines GL1 to GLn and a corresponding data line of the data lines DL1 to DLm. In an embodiment, other types of signal lines may be further provided in the display panel DP depending on the configuration of the pixel driving circuit of the pixels PX11 to PXnm.

The driving circuit GDC may be disposed in the non-display area NDA, however, it should not be limited thereto or thereby. In an embodiment, some of components of the driving circuit GDC may be disposed in the display area DA, and thus, a size of the non-display area NDA may be reduced. The driving circuit GDC may include a gate driving circuit. The gate driving circuit may generate the gate signals and may sequentially output the gate signals to the gate lines GL1 to GLn. The gate driving circuit may further output another control signal to the pixel driving circuit of the pixels PX11 to PXnm.

The pads PD may be arranged in the non-display area NDA along one direction. The pads PD may be connected to a circuit board. Each of the pads PD may be connected to a corresponding signal line among the signal lines GL1 to GLn and DL1 to DLm and may be connected to a corresponding pixel via the signal line. The pads PD may be provided integrally with the signal lines GL1 to GLn and DL1 to DLm, however, they should not be limited thereto or thereby. According to an embodiment, the pads PD may be disposed on a different layer from the signal lines GL1 to GLn and DL1 to DLm and may be connected to the signal lines via a contact hole.

FIG. 4 shows an embodiment where a sealing member placement area SAL-a corresponding to an area in which the sealing member SAL (refer to FIG. 3) is disposed when viewed in the plan view as a representative example. The sealing member placement area SAL-a may correspond to a portion of the non-display area NDA. The sealing member placement area SAL-a may be adjacent to an edge of the display panel DP and may extend along a direction in which the edge of the display panel DP extends. The sealing member placement area SAL-a may surround the display area DA when viewed in the plan view. According to an embodiment, the sealing member placement area SAL-a may be disposed outside an area where the driving circuit GDC is disposed.

Figure 5A:
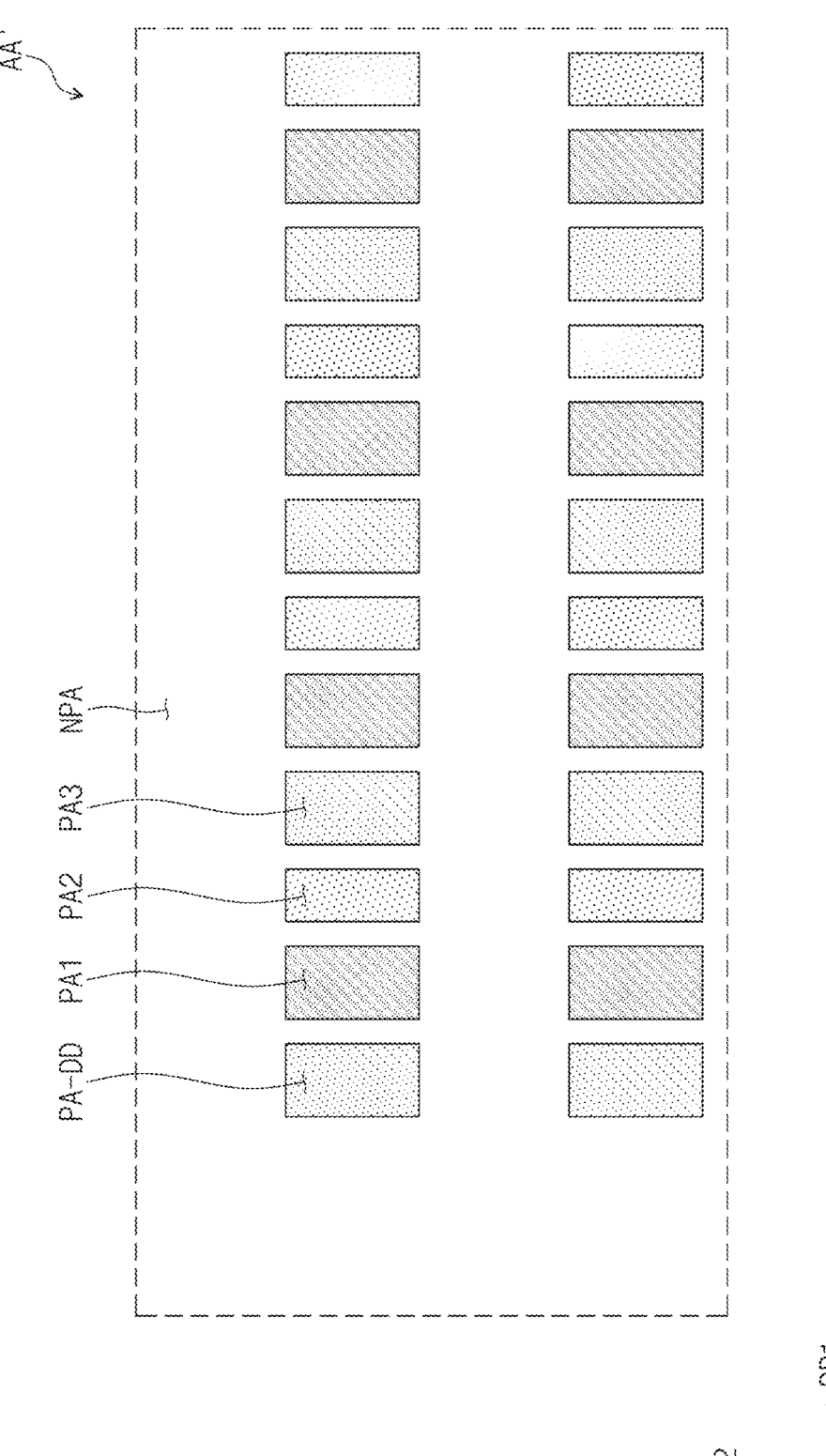
Figure 5B:
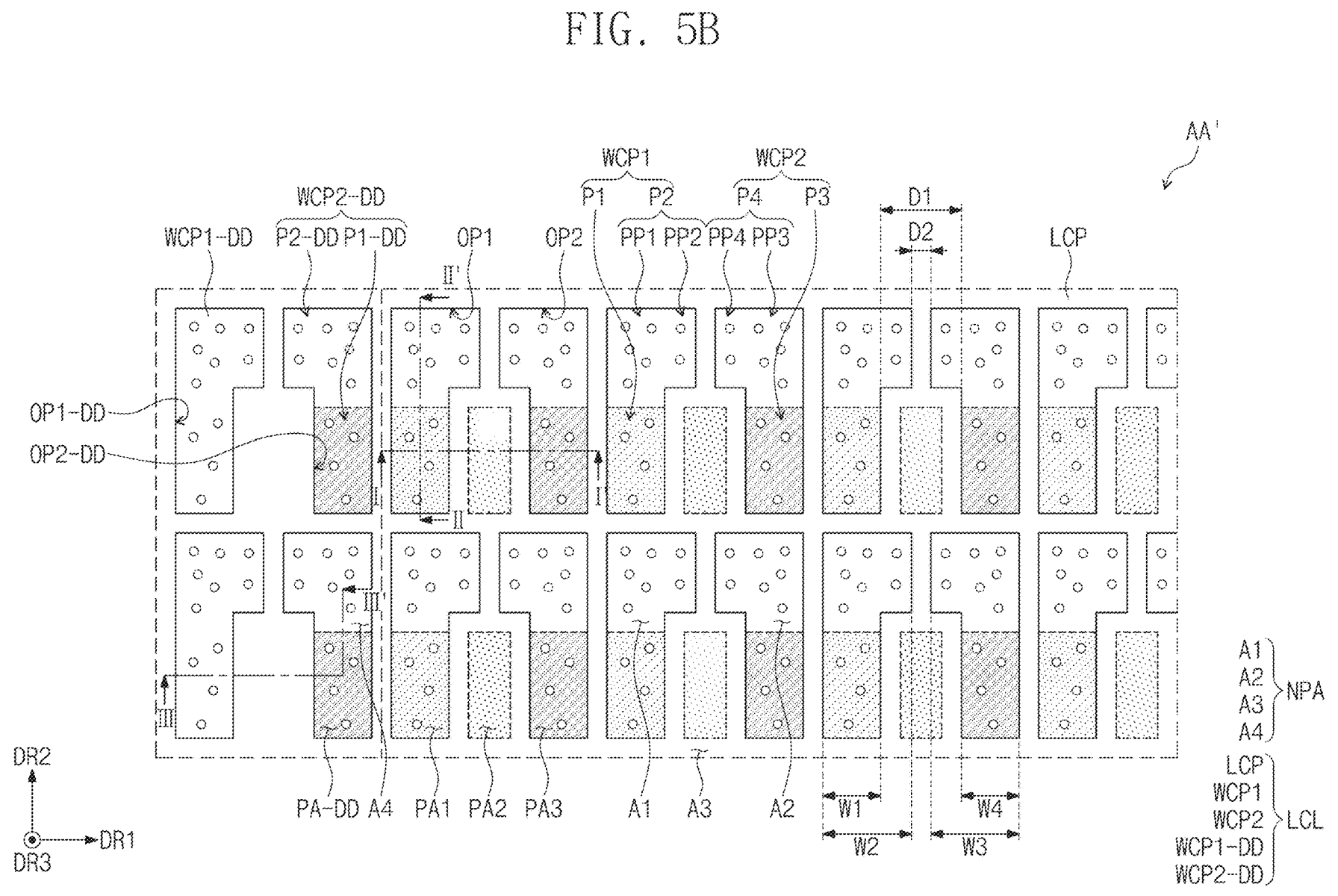
Figure 6B:
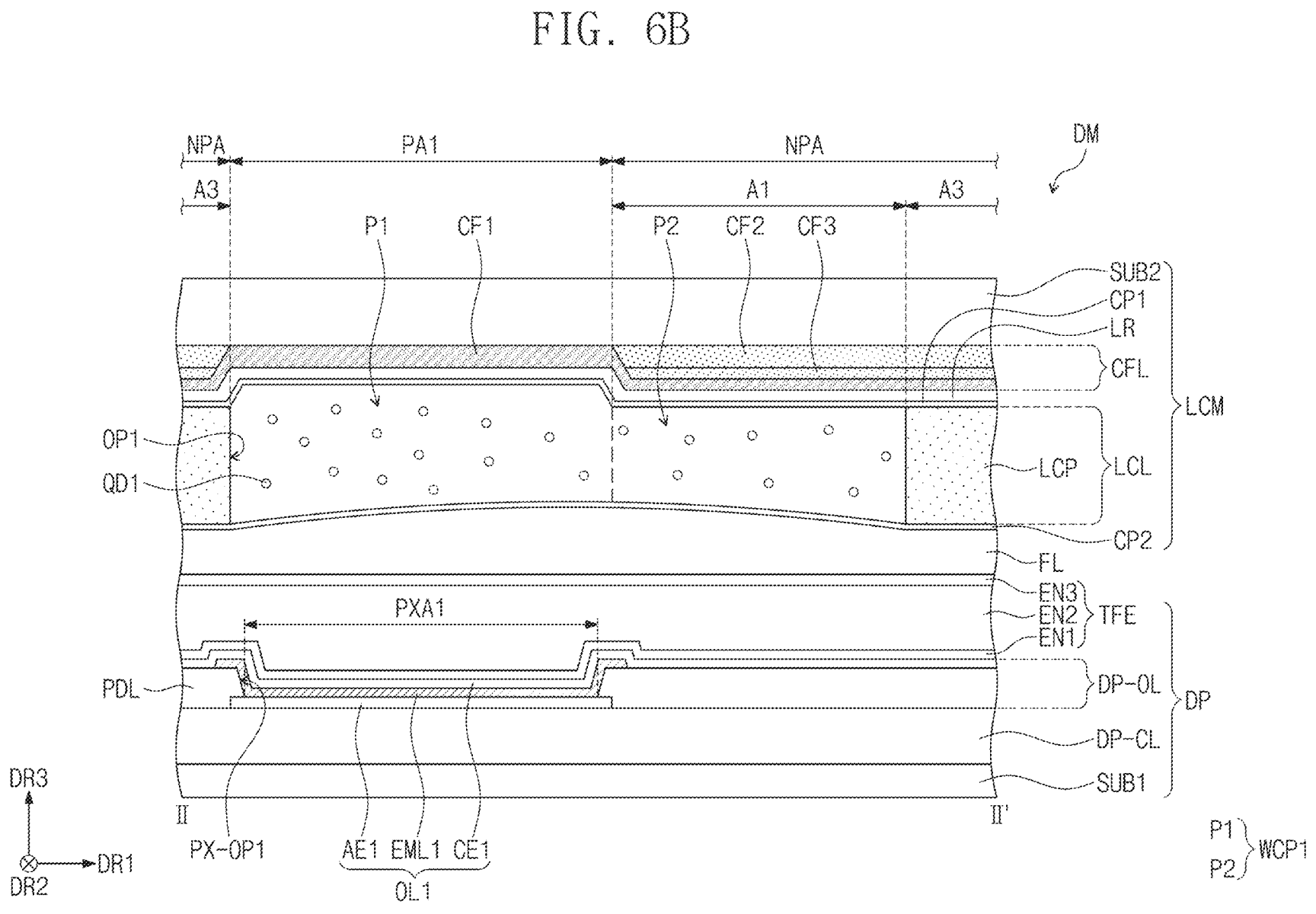
Figure 6C:
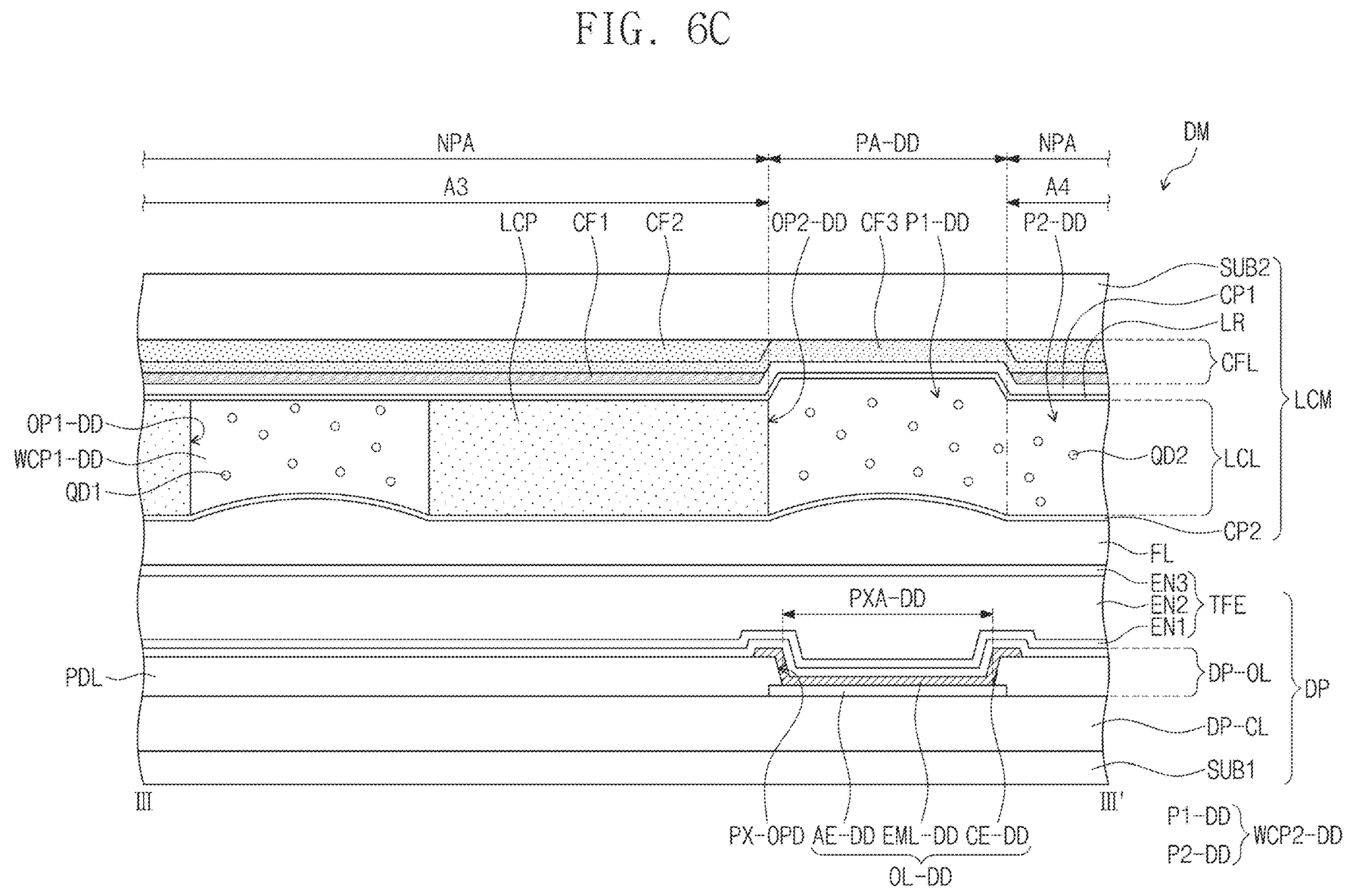

FIGS. 5A and 5B are enlarged plan views of the display panel according to an embodiment of the disclosure. FIGS. 5A and 5B are enlarged plan views of an area AA' of the display area DA shown in FIG. 4. FIG. 6A is a cross-sectional view of the display module DM taken along line I-I' of FIG. 5B. FIG. 6B is a cross-sectional view of the display module DM taken along line II-II' of FIG. 5B. FIG. 6C is a cross-sectional view of the display module DM taken along line of FIG. 5B.

FIG. 5A shows areas in which a light is emitted toward the front surface of the display device DD (refer to FIG. 1), i.e., light emitting areas or pixel areas, when the display device DD (refer to FIG. 1) is operated, and FIG. 5B shows an arrangement relationship between the areas in which the light is emitted toward the front surface of the display device DD (refer to FIG. 1) and components of the light control layer LCL.

Referring to FIGS. 5A and 5B, the display area DA (refer to FIG. 4) may include pixel areas PA1, PA2, and PA3 and a light blocking area NPA surrounding the pixel areas PA1, PA2, and PA3.

The pixel areas PA1, PA2, and PA3 may be defined as areas where the light provided from the light emitting elements is emitted to the outside of the display device DD (refer to FIG. 1) and perceived by the user when the display device DD is operated. The pixel areas PA1, PA2, and PA3 may include a first pixel area PA1, a second pixel area PA2, and a third pixel area PA3. The first, second, and third pixel areas PA1, PA2, and PA3 may be distinguished from each other according to a color of the light emitted to the outside of the display device DD (refer to FIG. 1).

The light blocking area NPA may be defined as an area where the light is not emitted to the outside of the display device DD (refer to FIG. 1) since the light is not provided from the light emitting elements or the light is blocked by internal components of the display module DM (refer to FIG. 2). The light blocking area NPA may be defined as a boundary between the first, second, and third pixel areas PA1, PA2, and PA3 and may prevent a color mixture from occurring between the first, second, and third pixel areas PA1, PA2, and PA3. In an embodiment, the first, second, and third pixel areas PA1, PA2, and PA3 and the light blocking area NPA may be defined by internal components of the color filter layer CFL (refer to FIG. 3) and this will be described in detail later.

The first, second, and third pixel areas PA1, PA2, and PA3 may be repeatedly arranged in a predetermined arrangement within the display area DA. In the embodiment, the first, second, and third pixel areas PA1, PA2, and PA3 may be alternately arranged in the first direction DR1 to form one pixel row. That is, the first pixel area PA1, the second pixel area PA2, and the third pixel area PA3, which are sequentially arranged, may be repeatedly arranged in the one pixel row. Each of the first pixel areas PA1, the second pixel areas PA2, and the third pixel areas PA3 may be arranged in the second direction DR2 to form one pixel column. That is, the pixel row in which the first, second, and third pixel areas PA1, PA2, and PA3 are alternately arranged may be repeatedly arranged along the second direction DR2.

Each of the first, second, and third pixel areas PA1, PA2, and PA3 may have a quadrangular shape when viewed in the plan view. In an embodiment, for example, each of the first, second, and third pixel areas PA1, PA2, and PA3 may include long sides extending in the second direction DR2 and short sides extending in the first direction DR1, however, it should not be limited thereto or thereby. According to an embodiment, each of the first, second, and third pixel areas PA1, PA2, and PA3 may have a polygonal shape, a circular shape, an oval shape, or an irregular shape.

When viewed in the plan view, the second pixel area PA2 may have a size smaller than that of the first and third pixel areas PA1 and PA3. When viewed in the plan view, the first and third pixel areas PA1 and PA3 may have substantially the same size as each other, however, they should not be limited thereto or thereby. According to an embodiment, the first, second, and third pixel areas PA1, PA2, and PA3 may have substantially the same size as each other, or the first and third pixel areas PA1 and PA3 may have different sizes from each other.

As shown in FIG. 5B, the light control layer LCL may include the light control pattern LCP and the light conversion patterns WCP1 and WCP2, and the light conversion patterns WCP1 and WCP2 may include first light conversion patterns WCP1 respectively corresponding to the first pixel areas PA1 and second light conversion patterns WCP2 respectively corresponding to the third pixel areas PA3.

A second color light obtained by converting the source light (or the first color light) by the first light conversion patterns WCP1 may be provided to the first pixel areas PA1, and a third color light obtained by converting the source light (or the first color light) by the second light conversion patterns WCP2 may be provided to the third pixel areas PA3. The second pixel areas PA2 may not overlap the first and second light conversion patterns WCP1 and WCP2, and the first color light corresponding to the source light may be provided to the second pixel areas PA2.

Each of the second color light and the third color light may have a color different from that of the source light or the first color light, and the third color light may have a color different from that of the second color light. According to an embodiment, the source light (or the first color light) may have a wavelength shorter than a wavelength of the second color light and a wavelength of the third color light, and the wavelength of the second color light and the wavelength of the third color light may be different from each other. In an embodiment, for example, the first color light may be a blue light, the second color light may be a green light, and the third color light may be a red light, however, the first, second, and third color lights should not be limited thereto or thereby. According to an embodiment, the first color light may be the blue light, the second color light may be the red light, and the third color light may be the green light. Hereinafter, embodiments where the first, second, and third color lights are the blue light, the green light, and the red light, respectively, will be described in detail for convenience of description.

According to embodiments of the disclosure, as the pixel rows defined by the pixel areas PA1, PA2, and PA3 may have a structure in which the first, second, and third pixel areas PA1, PA2, and PA3 are alternately arranged, all the first, second, and third color lights may be provided in each of the pixel rows, and a light having a certain color may not be emitted. Accordingly, an occurrence of a color sticking-out phenomenon in which a certain color is displayed at a boundary of the image, in particular, an upper boundary portion and/or a lower boundary portion, may be reduced. Thus, colors may be accurately displayed, and a visibility of the display device DD (refer to FIG. 1) may be improved.

According to a comparative example, pixel rows defined by pixel areas may have different arrangements depending on their positions, and in this case, only some of first, second, and third color lights are provided in each of the pixel rows. For example, in a case where third pixel areas are arranged in a 2k-th (k is a natural number) pixel row and first and second pixel areas are alternately arranged in a (2k+1)-th pixel row, only the third color light is provided from the 2k-th pixel row, and a light obtained by mixing the first and second color lights is provided from the (2k+1)-th pixel row. As a result, according to the comparative embodiment, a certain color appears prominently in the boundary of the image, in particular, the upper boundary portion and/or the lower boundary portion, and defects in visibility occur due to the color sticking-out phenomenon.

In an embodiment, the display area DA may further include dummy pixel areas PA-DD, and the dummy pixel areas PA-DD may be surrounded by the light blocking area NPA. The dummy pixel areas PA-DD may be arranged at a leftmost side within the display area DA (refer to FIG. 4). Each of the dummy pixel areas PA-DD may be arranged in a same row as a corresponding pixel row among the pixel rows in which the first, second, and third pixel areas PA1, PA2, and PA3 are arranged. The dummy pixel areas PA-DD may be arranged in the second direction DR2. The dummy pixel areas PA-DD may be defined as areas at the leftmost side of the display area DA (refer to FIG. 4) from which the light is emitted to the outside of the display device DD (refer to FIG. 1).

However, positions of the dummy pixel areas PA-DD should not be limited thereto or thereby, and alternatively, the dummy pixel areas PA-DD may be arranged at a rightmost side within the display area DA (refer to FIG. 4) or may be arranged at both the leftmost side and the rightmost side. In another alternative embodiment, the dummy pixel areas PA-DD may be omitted.

In an embodiment, similar to the pixel areas PA1, PA2, and PA3, the dummy pixel areas PA-DD may be also defined by the internal components of the color filter layer CFL (refer to FIG. 3).

In an embodiment, the dummy pixel areas PA-DD may be formed for the convenience of process so that the pixel areas PA1, PA2, and PA3 may have a certain arrangement order. The dummy pixel areas PA-DD will be described in detail later.

FIG. 6A shows a cross-section of the display module DM corresponding to one first pixel area PA1, one second pixel area PA2, and one third pixel area PA3, which are arranged in the first direction DR1. FIG. 6B shows a cross-section of the display module DM in one first pixel area PA1 extending in the second direction DR2. Hereinafter, components of the display panel DP and components of the light control member LCM according to an embodiment will be described in detail with reference to FIGS. 5B, 6A, and 6B.

In an embodiment, the display panel DP may include the base layer SUB1, the circuit layer DP-CL, the display element layer DP-OL, and the encapsulation layer TFE.

The base layer SUB1 may include a glass substrate, a polymer substrate, or an organic/inorganic composite material substrate. The base layer SUB1 may have a single-layer or multi-layer structure. In an embodiment, for example, the base layer SUB1 having the multi-layer structure may include synthetic resin layers and at least one inorganic layer disposed between the synthetic resin layers or may include a glass substrate and a synthetic resin layer disposed on the glass substrate. However, the base layer SUB1 should not be limited thereto or thereby.

The synthetic resin layer included in the base layer SUB1 may include at least one selected from an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, a perylene-based resin, and a polyimide-based resin, however, a material for the synthetic resin layer should not be limited thereto or thereby.

The circuit layer DP-CL may include an insulating layer, a semiconductor pattern, a conductive pattern, and a signal line. The insulating layer, a semiconductor layer, and a conductive layer may be formed on the base layer SUB1 by a coating or depositing process in a manufacturing process of the circuit layer DP-CL. Then, the insulating layer, the semiconductor layer, and the conductive layer may be selectively patterned through several photolithography processes, and thus, the semiconductor pattern, the conductive pattern, and the signal line, which are included in the circuit layer DP-CL, may be formed.

The circuit layer DP-CL may include driving elements of an equivalent circuit of the pixels. The driving elements may include transistors respectively connected to the light emitting elements. Each of the transistors may include the semiconductor pattern. The semiconductor pattern of the transistor may be arranged in a predetermined rule in the plan view according to the equivalent circuit of the pixel. The semiconductor pattern may include polycrystalline silicon, amorphous silicon, crystalline oxide, or amorphous oxide.

The display element layer DP-OL may be disposed the circuit layer DP-CL. The display element layer DP-OL may include a plurality of light emitting elements OL1, OL2, and OL3 and a pixel definition layer PDL.

The light emitting elements OL1, OL2, and OL3 may include a first light emitting element OL1, a second light emitting element OL2, and a third light emitting element OL3. Each of the first, second, and third light emitting elements OL1, OL2, and OL3 may include one of first electrodes AE1, AE2, and AE3, one of light emitting layers EML1, EML2, and EML3, and one of second electrodes CE1, CE2, and CE3.

The first electrodes AE1, AE2, and AE3 of the first, second, and third light emitting elements OL1, OL2, and OL3 may be disposed on the circuit layer DP-CL and may be spaced apart from each other. The first electrodes AE1, AE2, and AE3 of the first, second, and third light emitting elements OL1, OL2, and OL3 may be connected to the transistors of the circuit layer DP-CL, respectively.

The pixel definition layer PDL may be disposed on the circuit layer DP-CL. In an embodiment, for example, the pixel definition layer PDL may be disposed on an uppermost insulating layer of the circuit layer DP-CL. The pixel definition layer PDL may be provided with first, second, and third light emitting openings PX-OP1, PX-OP2, and PX- OP3 defined therethrough, that is, the first, second, and third light emitting openings PX-OP1, PX-OP2, and PX-OP3 may be defined through the pixel definition layer PDL. An area corresponding to the first electrode AE1 of the first light emitting element OL1 exposed through the first light emitting opening PX-OP1 may be defined as a first light emitting area PXA1. An area corresponding to the first electrode AE2 of the second light emitting element OL2 exposed through the second light emitting opening PX-OP2 may be defined as a second light emitting area PXA2. An area corresponding to the first electrode AE3 of the third light emitting element OL3 exposed through the third light emitting opening PX-OP3 may be defined as a third light emitting area PXA3.

The pixel definition layer PDL may include a polymer resin. In an embodiment, for example, the pixel definition layer PDL may include a polyacrylate-based resin or a polyimide-based resin. The pixel definition layer PDL may further include an inorganic material in addition to the polymer resin. According to an embodiment, the pixel definition layer PDL may include an inorganic material. In an embodiment, for example, the pixel definition layer PDL may include silicon nitride ($SiN_x$), silicon oxide ($SiO_x$), or silicon oxynitride ($SiO_xN_y$).

The pixel definition layer PDL may further include a light absorbing material. In an embodiment, for example, the pixel definition layer PDL may include a black coloring agent. The black coloring agent may include a black pigment or a black dye. The black coloring agent may include a metal material, such as carbon black, chrome, etc., or an oxide thereof. However, the pixel definition layer PDL should not be limited thereto or thereby.

The light emitting layers EML1, EML2, and EML3 of the first, second, and third light emitting elements OL1, OL2, and OL3 may be respectively disposed on the first electrodes AE1, AE2, and AE3. The light emitting layers EML1, EML2, and EML3 of the first, second, and third light emitting elements OL1, OL2, and OL3 may be disposed to correspond to the light emitting openings PX-OP1, PX-OP2, and PX-OP3, respectively. However, the disclosure should not be limited thereto or thereby. According to an alternative embodiment, each of the light emitting layers EML1, EML2, and EML3 of the first, second, and third light emitting elements OL1, OL2, and OL3 may be provided integrally with each other (or integrally formed as a single unitary and indivisible part) as a common layer.

The light emitting layers EML1, EML2, and EML3 may include an organic light emitting material, an inorganic light emitting material, a quantum dot, or a quantum rod. The light emitting layers EML1, EML2, and EML3 of the first, second, and third light emitting elements OL1, OL2, and OL3 may generate the source light. In the embodiment, the source light may be the first color light. In an embodiment, for example, the first color light may be the blue light, however, the disclosure should not be limited thereto or thereby.

In an embodiment, the light emitting layers EML1, EML2, and EML3 of the first, second, and third light emitting elements OL1, OL2, and OL3 may include substantially same components as each other or may have substantially a same thickness as each other, however, they should not be limited thereto or thereby. According to an alternative embodiment, the light emitting layers EML1, EML2, and EML3 of the first, second, and third light emitting elements OL1, OL2, and OL3 may include different components from each other and/or different thicknesses from each other.

According to an embodiment, each of the first, second, and third light emitting elements OL1, OL2, and OL3 may be a light emitting element having a tandem structure in which each of the light emitting layers EML1, EML2, and EML3 is provided in plural. The light emitting layers EML1, EML2, and EML3 of the first, second, and third light emitting elements OL1, OL2, and OL3 may generate lights having substantially a same color as each other. In an embodiment, for example, each of the first, second, and third light emitting elements OL1, OL2, and OL3 may include four light emitting layers, and the four light emitting layers may substantially generate the blue light, however, the disclosure should not be limited thereto or thereby. Alternatively, some of the light emitting layers EML1, EML2, and EML3 of the first, second, and third light emitting elements OL1, OL2, and OL3 may generate lights having different colors. In an embodiment, for example, three light emitting layers among the four light emitting layers may generate the blue light, and one light emitting layer among the four light emitting layers may generate the green light. Each of the first, second, and third light emitting elements OL1, OL2, and OL3 may further include functional layers such as a hole control layer and an electron control layer, which are disposed between corresponding light emitting layers EML1, EML2, and EML3.

The second electrodes CE1, CE2, and CE3 of the first, second, and third light emitting elements OL1, OL2, and OL3 may be disposed on the light emitting layers EML1, EML2, and EML3, respectively. The second electrodes CE1, CE2, and CE3 of the first, second, and third light emitting elements OL1, OL2, and OL3 may be connected to each other and may be provided integrally with each other as a common layer. A common voltage may be provided to the pixels via the second electrodes CE1, CE2, and CE3 connected to each other.

A first voltage may be applied to the first electrodes AE1, AE2, and AE3, and a second voltage different from the first voltage may be applied to the second electrodes CE1, CE2, and CE3. Holes and electrons, which are injected into each of the light emitting layers EML1, EML2, and EML3, may be recombined with each other to generate excitons. Each of the first, second, and third light emitting elements OL1, OL2, and OL3 may emit the light when the excitons return to a ground state from an excited state.

The first, second, and third light emitting elements OL1, OL2, and OL3 may further include a light emitting functional layer, such as the hole control layer and the electron control layer, disposed between the first electrodes AE1, AE2, and AE3 and the second electrodes CE1, CE2, and CE3. The hole control layer may be disposed between the first electrodes AE1, AE2, and AE3 and the light emitting layers EML1, EML2, and EML3 and may include at least one selected from a hole transport layer and a hole injection layer. The electron control layer may be disposed between the light emitting layers EML1, EML2, and EML3 and the second electrodes CE1, CE2, and CE3 and may include at least one selected from an electron transport layer and an electron injection layer. The light emitting functional layer of the first, second, and third light emitting elements OL1, OL2, and OL3 may be integrally provided with each other as a common layer.

The encapsulation layer TFE may be disposed on the display element layer DP-OL and may encapsulate the light emitting elements OL1, OL2, and OL3. The encapsulation layer TFE may include first, second, and third encapsulation layers EN1, EN2, and EN3. The first encapsulation layer EN1 may be disposed on the second electrodes CE1, CE2, and CE3, and the second and third encapsulation layers EN2 and EN3 may be sequentially disposed on the first encapsulation layer EN1.

According to an embodiment, the first and third encapsulation layers EN1 and EN3 may include an inorganic layer, and the inorganic layer may protect the display element layer DP-OL from moisture and/or oxygen. In an embodiment, for example, the inorganic layer may include at least one selected from aluminum oxide, titanium oxide, silicon oxide, silicon nitride, silicon oxynitride, zirconium oxide, and hafnium oxide, however, the material of the inorganic layer should not be limited thereto or thereby.

The second encapsulation layer EN2 may include an organic layer, and the organic layer may protect the display element layer DP-OL from a foreign substance such as dust particles. In an embodiment, for example, the organic layer may include an acrylic-based resin, however, the material of the organic layer should not be limited thereto or thereby.

The filling member FL may be disposed between the display panel DP and the light control member LCM. The empty space between the display panel DP and the light control member LCM may be filled by the filling member FL.

The light control member LCM may be disposed on the display panel DP. The light control member LCM may include first, second, and third pixel areas PA1, PA2, and PA3 and a light blocking area NPA. The first, second, and third pixel areas PA1, PA2, and PA3 and the light blocking area NPA of the light control member LCM may correspond to the first, second, and third pixel areas PA1, PA2, and PA3 and the light blocking area NPA of the display area DA (refer to FIG. 4) described with reference to FIG. 5A.

The first, second, and third pixel areas PA1, PA2, and PA3 may correspond to the first, second, and third light emitting areas PXA1, PXA2, and PXA3, respectively. Each of the first, second, and third pixel areas PA1, PA2, and PA3 may have a size equal to or greater than that of a corresponding light emitting area among the first, second, and third light emitting areas PXA1, PXA2, and PXA3.

In an embodiment, the light control member LCM may include the base substrate SUB2, the color filter layer CFL, the low refractive index layer LR, the light control layer LCL, a first capping layer CP1, and a second capping layer CP2.

The rear surface of the base substrate SUB2 may face the upper surface of the base layer SUB1. In an embodiment, the color filter layer CFL, the low refractive index layer LR, the first capping layer CP1, the light control layer LCL, and the second capping layer CP2 may be sequentially staked on the rear surface of the base substrate SUB2 along a direction closer to the display panel DP, i.e., a direction opposite to the third direction DR3. According to an embodiment, the second capping layer CP2, the light control layer LCL, the first capping layer CP1, the low refractive index layer LR, the color filter layer CFL, and the base substrate SUB2 may be sequentially stacked on the upper surface of the display panel DP along the third direction DR3.

The light control layer LCL may be disposed between the filling member FL and the low refractive index layer LR. The light control layer LCL may include the light control pattern LCP, the first light conversion pattern WCP1, and the second light conversion pattern WCP2.

A first opening OP1 corresponding to the first light emitting area PXA1 and a second opening OP2 corresponding to the third light emitting area PXA3 may be defined through the light control pattern LCP. The first opening OP1 may provide a space in which the first light conversion pattern WCP1 is disposed, and the second opening OP2 may provide a space in which the second light conversion pattern WCP2 is disposed.

In an embodiment, as shown in FIG. 5B, the first opening OP1 may overlap the first pixel area PA1 and a portion (hereinafter, referred to as a first area A1) of the light blocking area NPA adjacent to the first pixel area PA1. The second opening OP2 may overlap the third pixel area PA3 and another portion (hereinafter, referred to as a second area A2) of the light blocking area NPA adjacent to the third pixel area PA3.

When viewed in the plan view, the first area A1 of the light blocking area NPA may protrude from the first pixel area PA1 to the second direction DR2. When viewed in the plan view, the second area A2 of the light blocking area NPA may protrude from the third pixel area PA3 to the second direction DR2. A portion of the second pixel area PA2 may overlap a portion of the first area A1 of the light blocking area NPA when viewed in the second direction DR2. Another portion of the second pixel area PA2 may overlap a portion of the second area A2 of the light blocking area NPA when viewed in the second direction DR2.

According to an embodiment, the first opening OP1 may include a portion extending in the second direction DR2 and a portion protruding from the portion to the first direction DR1 when viewed in the plan view. According to an embodiment, the second opening OP2 may include a portion extending in the second direction DR2 and a portion protruding from the portion to a direction opposite to the first direction DR1 when viewed in the plan view. According to an embodiment, the first and second openings OP1 and OP2 may be symmetrical to each other based on an imaginary line extending in the second direction DR2 from a center line of the second pixel area PA2 when viewed in the plan view.

Each of the first opening OP1 and the second opening OP2 may be provided in plural, the first openings OP1 may be alternately arranged with the second openings OP2 in the first direction DR1, and each of the first openings OP1 and the second openings OP2 may be arranged in the second direction DR2.

The light control pattern LCP may include a photosensitive resin. Accordingly, the light control pattern LCP may be patterned by a photolithography process. In an embodiment, for example, the light control pattern LCP may include a base resin and an additive. The additive may include a coupling agent and/or a photoinitiator. The additive may further include a dispersant. The light control pattern LCP may include a light transmissive material that transmits the source light. That is, the light control pattern LCP may output the light incident thereinto to the outside of the light control pattern LCP as it is without converting the light incident thereinto.

The light control pattern LCP may overlap the second pixel area PA2 and the other area (hereinafter, referred to as a third area A3) of the light blocking area NPA except for the first and second areas A1 and A2 of the light blocking area NPA. The source light provided by the second light emitting element OL2 may be provided as a light having substantially a same color as that of the source light in the second pixel area PA2 after passing through the light control pattern LCP. That is, a portion of the light control pattern LCP, which overlaps the second pixel area PA2, may serve as a light transmission portion. In an embodiment, for example, the blue light may be provided in the second pixel area PA2.

The light control pattern LCP may further include scattering particles. The scattering particles may scatter the light incident to the light control pattern LCP from the second light emitting element OL2 in several directions. The scattering particles may be particles having a relatively large density or specific gravity. In an embodiment, for example, the scattering particles may include titanium oxide ($TiO_2$) or silica-based nanoparticles. The scattering particles may improve a light emitting efficiency of the light provided from the second light emitting element OL2 and passing through the light control pattern LCP.

The first light conversion pattern WCP1 may be disposed in the first opening OP1 of the light control pattern LCP. The first light conversion pattern WCP1 may correspond to the first light emitting area PXA1. The second light conversion pattern WCP2 may be disposed in the second opening OP2 of the light control pattern LCP. The second light conversion pattern WCP2 may correspond to the third light emitting area PXA3.

The first light conversion pattern WCP1 may include a base resin and first quantum dots QD1 dispersed in the base resin. The second light conversion pattern WCP2 may include a base resin and second quantum dots QD2 dispersed in the base resin. The first and second light conversion patterns WCP1 and WCP2 may be formed by an inkjet process, and the light control pattern LCP may serve as a barrier wall during the inkjet process.

The first quantum dots QD1 may convert a wavelength range of the source light provided by the first light emitting elements OL1 to a second color light having a wavelength range different from the wavelength range of the source light. The second quantum dots QD2 may convert a wavelength range of the source light provided by the third light emitting elements OL3 to a third color light having a wavelength range different from the wavelength range of the source light.

The first and second quantum dots QD1 and QD2 may be particles to convert the wavelength range of the source light. A core of the first and second quantum dots QD1 and QD2 may be selected from a group II-VI compound, a group III-VI compound, a group compound, a group III-V compound, a group IV-VI compound, a group IV element, a group IV compound, and a combination thereof.

The group II-VI compound may be selected from a binary compound selected from CdSe, CdTe, CdS, ZnS, ZnSe, ZnTe, ZnO, HgS, HgSe, HgTe, MgSe, MgS, and a mixture thereof, a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The group III-VI compound may include a binary compound of $In_2S_3$ or $In_2Se_3$, a ternary compound of $InGaS_3$ or $InGaSe_3$, or an arbitrary combination thereof.

The group I-III-VI compound may include a ternary compound selected from AgInS, $AgInS_2$, CuInS, $CuInS_2$, $AgGaS_2$, $CuGaS_2$ $CuGaO_2$, $AgGaO_2$, $AgAlO_2$, and a mixture thereof, or a quaternary compound of $AgInGaS_2$, $CuInGaS_2$, or the like.

The group III-V compound may be selected from a binary compound selected from GaN, GaP, GaAs, GaSb, AlN, AlP, AlAs, AlSb, InN, InP, InAs, InSb, and a mixture thereof, a ternary compound selected from GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, and a quaternary compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The group III-V compound may further include a group II metal. In an embodiment, for example, InZnP may be selected as a group III-II-V compound.

The group IV-VI compound may be selected from a binary compound selected from SnS, SnSe, SnTe, PbS, PbSe, PbTe, and a mixture thereof, a ternary compound selected from SnSeS, SnSeTe, SnSTe, PbSeS, PbSeTe, PbSTe, SnPbS, SnPbSe, SnPbTe, and a mixture thereof, and a quaternary compound selected from SnPbSSe, SnPbSeTe, SnPbSTe, and a mixture thereof. The group IV element may be selected from Si, Ge, and a mixture thereof. The group IV compound may be a binary compound selected from SiC, SiGe, and a mixture thereof.

In such an embodiment, the binary compound, the ternary compound, or the quaternary compound may exist in the particles at a uniform concentration or may exist in a same particle after being divided into plural portions having different concentrations from each other.

The first and second quantum dots QD1 and QD2 may have a core-shell structure including a core and a shell surrounding the core. In addition, according to an embodiment, each of the first and second quantum dots QD1 and QD2 may have a core-shell structure in which one quantum dot surrounds another quantum dot. In the core/shell structure, the concentration of elements existing in the shell may have a concentration gradient that decreases toward the core.

The first and second quantum dots QD1 and QD2 may have a core-shell structure that includes nanocrystal. The shell of the quantum dot may serve as a protective layer to prevent chemical modification of the core and to maintain semiconductor properties and/or may serve as a charging layer to impart electrophoretic properties to the quantum dot. The shell may have a single-layer or multi-layer structure. The shell of the quantum dots may include metal oxides, non-metal oxides, semiconductor compounds, or combinations thereof as its representative example.

The metal oxides or non-metal oxides may include a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a ternary compound, such as $MgAl_2O_4$, $CoFe_2O_4$, $NiFe_2O_4$, and $CoMn_2O_4$, however, they should not be limited thereto or thereby.

In addition, the semiconductor compounds may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, or AlSb, however, they should not be limited thereto or thereby.

The first and second quantum dots QD1 and QD2 may have a full width of half maximum (FWHM) of the light emission wavelength spectrum of about 45 nanometers (nm) or less, e.g., about 40 nm or less, or about 30 nm or less. The color purity and the color reproducibility may be improved within this range. In addition, since the light emitted through the quantum dots may be emitted in all directions, an optical viewing angle may be improved.

The shape of the first and second quantum dots QD1 and QD2 may have a shape commonly used in the art, and it should not be particularly limited. In an embodiment, spherical, pyramidal, multi-arm, or cubic nanoparticles, nanotubes, nanowires, nanofibers, nanoplatelets, or the like may be applied to the quantum dots.

The first and second quantum dots QD1 and QD2 may control the color of the emitted light depending on a particle size thereof, and accordingly, the first and second quantum dots QD1 and QD2 may have various emission colors such as blue, red, and green colors. In an embodiment where the light emitting layer includes the quantum dot material, details of the first and second quantum dots QD1 and QD2 described above may be equally applied to the quantum dot material included in the light emitting layer.

Each of the first light conversion pattern WCP1 and the second light conversion pattern WCP2 may further include scattering particles dispersed in the base resin. The above descriptions on the scattering particles of the light control pattern LCP may be equally applied to the scattering particles included in the first light conversion pattern WCP1 and the second light conversion pattern WCP2. The scattering particles included in the first light conversion pattern WCP1 and the second light conversion pattern WCP2 may scatter lights in the light control layer, and thus, a light conversion efficiency of the first and second quantum dots QD1 and QD2 may be improved.

The first light conversion pattern WCP1 may include a first portion P1 and a second portion P2. The first portion P1 may overlap the first pixel area PA1, and the second color light may exit from the first portion P1 to the outside of the display module DM when the display device DD (refer to FIG. 1) is operated. The second portion P2 may overlap the first area A1 of the light blocking area NPA, and a light may not exit from the second portion P2 to the outside of the display module DM when the display device DD (refer to FIG. 1) is operated.

In an embodiment, as shown in FIG. 5B, the second portion P2 may protrude from the first portion P1 in the second direction DR2 when viewed in the plan view. The second portion P2 may include a first sub-portion PP1 and a second sub-portion PP2. The first sub-portion PP1 may be a portion extending from the first portion P1 to the second direction DR2, and the second sub-portion PP2 may be a portion extending from the first sub-portion PP1 to the first direction DR1.

The second portion P2 may have a width greater than a width of the first portion P1 in the first direction DR1 In an embodiment, a maximum width W2 in the first direction DR1 of the second portion P2 may correspond to a sum of a width in the first direction DR1 of the first sub-portion PP1 and a width in the first direction DR1 of the second sub-portion PP2. Accordingly, the maximum width W2 in the first direction DR1 of the second portion P2 may be greater than a maximum width W1 in the first direction DR1 of the first portion P1.

The second light conversion pattern WCP2 may include a third portion P3 and a fourth portion P4. The third portion P3 may overlap the third pixel area PA3, and the third color light may exit from the third portion P3 to the outside of the display module DM when the display device DD (refer to FIG. 1) is operated. The fourth portion P4 may overlap the second area A2 of the light blocking area NPA, and a light may not exit from the fourth portion P4 to the outside of the display module DM when the display device DD (refer to FIG. 1) is operated.

When viewed in the plan view, the fourth portion P4 may protrude from the third portion P3 in the second direction DR2. The fourth portion P4 may include a third sub-portion PP3 and a fourth sub-portion PP4. The third sub-portion PP3 may be a portion extending from the third portion P3 to the second direction DR2, and the fourth sub-portion PP4 may be a portion extending from the third sub-portion PP3 to the direction opposite to the first direction DR1.

The third portion P3 may face the first portion P1 in the first direction DR1, and in this case, the fourth sub-portion PP4 may directly face the second sub-portion PP2 in the first direction DR1. A minimum separation distance D2 between the second portion P2 and the fourth portion P4 may be smaller than a minimum separation distance D1 between the first portion P1 and the third portion P3.

The fourth portion P4 may have a width greater than a width of the third portion P3 in the first direction DR1. In an embodiment, a maximum width W4 in the first direction DR1 of the fourth portion P4 may correspond to a sum of a width in the first direction DR1 of the third sub-portion PP3 and a width in the first direction DR1 of the fourth sub-portion PP4. Accordingly, the maximum width W4 in the first direction DR1 of the fourth portion P4 may be greater than a maximum width W3 in the first direction DR1 of the third portion P3.

When viewed in the plan view, the first light conversion pattern WCP1 and the second light conversion pattern WCP2 may have substantially the same shape as the first opening OP1 and the second opening OP2, respectively. According to an embodiment, the first light conversion pattern WCP1 and the second light conversion pattern WCP2 may be symmetrical to each other with respect to the imaginary line extending from the center line of the second pixel area PA2 when viewed in the plan view.

Each of the first light conversion pattern WCP1 and the second light conversion pattern WCP2 may be provided in plural, and the first light conversion patterns WCP1 and the second light conversion patterns WCP2 may have substantially the same arrangement as the arrangement of the first openings OP1 and the second openings OP2.

According to an embodiment of the disclosure, where an inkjet process is used to form the first light conversion pattern WCP1, the first opening OP1 overlapping the first area A1 of the light blocking area NPA may provide an impact margin area (hereinafter, referred to as an impact margin area for the first light conversion pattern WCP1) with respect to an ink. In an embodiment, where an inkjet process is used to form the second light conversion pattern WCP2, the second opening OP2 overlapping the second area A2 of the light blocking area NPA may provide an impact margin area (hereinafter, referred to as an impact margin area for the second light conversion pattern WCP2) with respect to the ink.

In an embodiment of the disclosure in which one pixel row is configured to include the first, second, and third pixel areas PA1, PA2, and PA3 alternately arranged in the first direction DR1 to prevent the color sticking-out phenomenon from occurring, the impact margin area may be provided between the pixel areas PA1, PA2, and PA3 forming one pixel row and the pixel areas PA1, PA2, and PA3 forming another pixel row adjacent to the one pixel row. In such an embodiment, a separation distance between the pixel rows adjacent to each other may be related to a resolution of the display device DD (refer to FIG. 1), so there may be restrictions in increasing an area between the pixel rows adjacent to each other.

According to an embodiment of the disclosure, the portion of the light control layer LCL, which overlaps the second pixel area PA2 and transmits the source light, corresponds to the light control pattern LCP and the light control pattern LCP is formed by a photolithography process, such that an ink impact margin area for a light transmissive member of the second pixel area PA2 may not be provided. Accordingly, a size ratio of each of the impact margin area for the first light conversion pattern WCP1 and the impact margin area for the second light conversion pattern WCP2 may increase within a narrow area due to space constraints.

In an embodiment, for example, the first opening OP1 overlapping the first area A1 of the light blocking area NPA may have a width greater than a width of the first opening OP1 overlapping the first pixel area PA1, and in addition, a first opening OP1 overlapping the first area A1 of the light blocking area NPA may overlap the second pixel area PA2 when viewed in the second direction DR2. That is, the impact margin area for the first light conversion pattern WCP1 may be expanded to an area adjacent to the second pixel area PA2. The descriptions on the impact margin area for the first light conversion pattern WCP1 may be applied to the impact margin area for the second light conversion pattern WCP2.

Accordingly, in embodiments of the disclosure, the impact margin area for the first light conversion pattern WCP1 and the impact margin area for the second light conversion pattern WCP2 are sufficiently provided without increasing the separation distance between the pixel rows adjacent to each other, such that an error in impact position of the ink may be prevented from occurring during the inkjet process. Accordingly, the color sticking-out phenomenon may be prevented from occurring, and a process reliability of the first and second light conversion patterns WCP1 and WCP2 may be improved. As a result, defects in visibility of the display device DD (refer to FIG. 1) may be reduced.

In an embodiment, as shown in FIGS. 6A and 6B, the low refractive index layer LR may be disposed on the light control layer LCL. The low refractive index layer LR may have a refractive index smaller than a refractive index of each of the light control pattern LCP, the first light conversion pattern WCP1, and the second light conversion pattern WCP2. The low refractive index layer LR may include a low refractive index organic layer with a relatively low refractive index. The low refractive index layer LR may further include hollow particles and/or voids distributed in an organic layer, and the refractive index of the low refractive index layer LR may be controlled by a ratio of the hollow particles and/or the voids.

The low refractive index layer LR may allow the lights that are not converted by the light conversion patterns WCP1 and WCP2 and exit from the upper surface of the light conversion patterns WCP1 and WCP2 to be incident again on the light conversion patterns WCP1 and WCP2 by using characteristics of the refractive index, and the lights incident again may be converted by the quantum dots QD1 and QD2. That is, the low refractive index layer LR may improve the light emitting efficiency of the display device DD (refer to FIG. 1) by recycling the light.

The low refractive index layer LR may include a material with a high light transmittance. In an embodiment, for example, the low refractive index layer LR may have the light transmittance equal to or greater than about 90%. As the low refractive index layer LR has the high light transmittance, the transmittance of the light traveling to the front surface of the display module DM may not be lowered.

The color filter layer CFL may be disposed on the low refractive index layer LR. In an embodiment, the color filter layer CFL may be disposed on the rear surface of the base substrate SUB2.

The color filter layer CFL may include a first color filter CF1, a second color filter CF2, and a third color filter CF3. The first, second, and third color filters CF1, CF2, and CF3 may be disposed to respectively correspond to the first, second, and third light emitting areas PXA1, PXA2, and PXA3. The first color filter CF1 may be disposed to overlap the first light emitting area PXA1, the second color filter CF2 may be disposed to overlap the second light emitting area PXA2, and the third color filter CF3 may be disposed to overlap the third light emitting area PXA3.

Each of the first, second, and third color filters CF1, CF2, and CF3 may include a base resin and a pigment or dye dispersed in the base resin. Each of the first, second, and third color filters CF1, CF2, and CF3 may transmit a light having a specific wavelength range and may absorb most of the light having a wavelength range outside the specific wavelength range. In an embodiment, for example, one of the first, second, and third color filters CF1, CF2, and CF3 may be a blue color filter, another of the first, second, and third color filters CF1, CF2, and CF3 may be a green color filter, and the other of the first, second, and third color filters CF1, CF2, and CF3 may be a red color filter.

The first color filter CF1 may overlap the first light conversion pattern WCP1. The first color filter CF1 may transmit the second color light provided from the first light conversion pattern WCP1. In an embodiment, for example, the first color filter CF1 may be the green color filter. The first color filter CF1 may transmit the green light provided from the first light conversion pattern WCP1 and may absorb the blue and red lights incident thereto. Accordingly, the light that is not converted by the first light conversion pattern WCP1 among lights incident into the first color filter CF1 may be absorbed by the first color filter CF1, and thus, a color purity may be prevented from being lowered in the first pixel area PXA1.

The second color filter CF2 may overlap the light control pattern LCP and may not overlap the first portion P1 of the first light conversion pattern WCP1 and the third portion P3 of the second light conversion pattern WCP2. The second color filter CF2 may transmit the light, which passes through the light control pattern LCP, of the source light provided from the second light conversion pattern WCP2. In an embodiment, for example, the second color filter CF2 may be the blue color filter. The second color filter CF2 may transmit the blue light provided from the second light control pattern LCP and may absorb the green and red lights incident thereto. Accordingly, the light that is converted by the light control pattern LCP among lights incident into the second color filter CF2 may be absorbed by the second color filter CF2, and thus, a color purity may be prevented from being lowered in the second pixel area PXA2.

The third color filter CF3 may overlap the second light conversion pattern WCP2. The third color filter CF3 may transmit the third color light provided from the second light conversion pattern WCP2. In an embodiment, for example, the third color filter CF3 may be the red color filter. The third color filter CF3 may transmit the red light provided from the second light conversion pattern WCP2 and may absorb the green and blue lights incident thereto. Accordingly, the light that is not converted by the second light conversion pattern WCP2 among lights incident into the third color filter CF3 may be absorbed by the third color filter CF3, and thus, a color purity may be prevented from being lowered in the third pixel area PXA3.

In an embodiment, the color filter layer CFL may filter an external light incident to the display module DM from the outside of the display module DM and may prevent the external light from being provided to the user after being reflected by conductive patterns, e.g., signal lines, electrodes, etc., in the display module DM. Accordingly, the color filter layer CFL may reduce a reflected light perceived by the user.

In an embodiment, as described above, the first, second, and third pixel areas PA1, PA2, and PA3 and the light blocking area NPA may be distinguished from each other by internal components of the color filter layer CFL. Accordingly, the color filter layer CFL may be regarded as including the first, second, and third pixel areas PA1, PA2, and PA3 and the light blocking area NPA.

The first pixel area PA1 may be defined as an area in which only the first color filter CF1 is disposed, the second pixel area PA2 may be defined as an area in which only the second color filter CF2 is disposed, and the third pixel area PA3 may be defined as an area in which only the third color filter CF3 is disposed.

In an embodiment, the light blocking area NPA may be defined as an area in which at least two color filters among the first, second, and third color filters CF1, CF2, and CF3 are stacked in the third direction DR3. That is, the second portion P2 of the first light conversion pattern WCP1 and the fourth portion P4 of the second light conversion pattern WCP2 may overlap the at least two color filters stacked in the third direction DR3. Accordingly, the light may be blocked by the at least two color filters stacked in the third direction DR3 in the light blocking area NPA, and thus, a color mixture between the first, second, and third pixel areas PA1, PA2, and PA3 may be prevented. FIG. 6B shows an embodiment having a structure in which the second portion P2 of the first light conversion pattern WCP1 overlaps the first, third, and second color filters CF1, CF3, and CF2 that are sequentially stacked in the third direction DR3 as a representative example. Although not shown in figures, similar to the second portion P2, the fourth portion P4 of the second light conversion pattern WCP2 may overlap the first, third, and second color filters CF1, CF3, and CF2 that are sequentially stacked in the third direction DR3.

The first capping layer CP1 may be disposed between the light control layer LCL and the low refractive index layer LR. The first capping layer CP1 may be disposed on the rear surface of the low refractive index layer LR facing the display panel DP. The first capping layer CP1 may include an inorganic material. The first capping layer CP1 may prevent moisture or gas from flowing into the low refractive index layer LR.

The second capping layer CP2 may be disposed between the filling member FL and the light control layer LCL. The second capping layer CP2 may be disposed on the rear surface of the light control layer LCL facing the display panel DP. The second capping layer CP2 may include an inorganic material. The second capping layer CP2 may prevent moisture or a foreign substance from entering the light control layer LCL. The first capping layer CP1 and the second capping layer CP2 may cover upper and lower portions of the light control layer LCL to protect the light control layer LCL and may prevent the light control layer LCL from being deteriorated by moisture.

FIG. 6C shows a cross-section of the display module DM corresponding to the dummy pixel area PA-DD. Referring to FIGS. 5B and 6C, the light control member LCM may further include the dummy pixel area PA-DD. The dummy pixel area PA-DD of the light control member LCM may correspond to the dummy pixel area PA-DD of the display area DA (refer to FIG. 4) described with reference to FIG. 5A.

The dummy pixel area PA-DD may be distinguished by the stacking form of components in the color filter layer CFL. Accordingly, the color filter layer CFL may be regarded as further including the dummy pixel area PA-DD. The dummy pixel area PA-DD may be an area in which only the third color filter CF3 is disposed.

The display element layer DP-OL may further include a dummy light emitting element OL-DD. The dummy light emitting element OL-DD may be disposed in an area overlapping the dummy pixel area PA-DD. The dummy light emitting element OL-DD may provide the source light. The dummy light emitting element OL-DD may include a first dummy electrode AE-DD, a dummy light emitting layer EML-DD, and a second dummy electrode CE-DD. Since the descriptions on the first electrodes AE1, AE2, and AE3, the light emitting layers EML1, EML2, and EML3, and the second electrodes CE1, CE2, and CE3 of the light emitting elements OL1, OL2, and OL3 may be applied to the first dummy electrode AE-DD, the dummy light emitting layer EML-DD, and the second dummy electrode CE-DD, respectively, any repetitive detailed description of the first dummy electrode AE-DD, the dummy light emitting layer EML-DD, and the second dummy electrode CE-DD will be omitted.

A first dummy opening OP1-DD and a second dummy opening OP2-DD may be further defined through the light control pattern LCP. The first dummy opening OP1-DD may overlap the light blocking area NPA, and the second dummy opening OP2-DD may overlap the dummy pixel area PA-DD and another portion (hereinafter, referred to as a fourth area A4) of the light blocking area NPA, which is adjacent to the dummy pixel area PA-DD.

In an embodiment, as shown in FIG. 5B, the first dummy opening OP1-DD may be spaced apart from the first and second openings OP1 and OP2 alternately arranged with each other in the first direction DR1. The second dummy opening OP2-DD may be disposed between the first dummy opening OP1-DD and the first and second openings OP1 and OP2 alternately arranged with each other in the first direction DR1. That is, the first and second dummy openings OP1-DD and OP2-DD may be arranged in a same row as the first and second openings OP1 and OP2. Each of the first dummy openings OP1-DD and the second dummy openings OP2-DD may be arranged in the second direction DR2.

When viewed in the plan view, the first dummy opening OP1-DD may have substantially the same shape as the first opening OP1, and the second dummy opening OP2-DD may have substantially the same shape as the second opening OP2.

The light control layer LCL may further include a first dummy light conversion pattern WCP1-DD and a second dummy light conversion pattern WCP2-DD. The first dummy light conversion pattern WCP1-DD may be disposed in the first dummy opening OP1-DD, and the second dummy light conversion pattern WCP2-DD may be disposed in the second dummy opening OP2-DD.

The first dummy light conversion pattern WCP1-DD may include the base resin and the first quantum dots QD1 dispersed in the base resin. That is, the first dummy light conversion pattern WCP1-DD may include a same material as that of the first light conversion pattern WCP1. The second dummy light conversion pattern WCP2-DD may include the base resin and the second quantum dots QD2 dispersed in the base resin. That is, the second dummy light conversion pattern WCP2-DD may include a same material as that of the second light conversion pattern WCP2.

The first dummy light conversion pattern WCP1-DD may not overlap the light emitting elements OL1, OL2, and OL3 and the dummy light emitting element OL-DD. Accordingly, the source light may not be provided to the first dummy light conversion pattern WCP1-DD. In addition, the first dummy light conversion pattern WCP1-DD may overlap the light blocking area NPA. Accordingly, the light may not be emitted from an area overlapping the first dummy light conversion pattern WCP1-DD.

The second dummy light conversion pattern WCP2-DD may overlap the dummy light emitting element OL-DD. Accordingly, the source light from the dummy light emitting element OL-DD may be provided to the second dummy light conversion pattern WCP2-DD. The second dummy light conversion pattern WCP2-DD may covert the source light provided from the dummy light emitting element OL-DD into the third color light by the second quantum dots QD2. In addition, the second dummy light conversion pattern WCP2-DD may overlap the dummy pixel area PA-DD and the fourth area A4 of the light blocking area NPA. The third color light may be provided to the dummy pixel area PA-DD.

As shown in FIG. 5B, when viewed in the plan view, the first dummy light conversion pattern WCP1-DD may have substantially the same shape as that of the first light conversion pattern WCP1, and the second dummy light conversion pattern WCP2-DD may have substantially the same shape as that of the second light conversion pattern WCP2. The second dummy light conversion pattern WCP2-DD may include a first dummy portion P1-DD overlapping the dummy pixel area PA-DD and a second dummy portion P2-DD overlapping a portion of the light blocking area NPA adjacent to the dummy pixel area PA-DD. The second dummy portion P2-DD may protrude from the first dummy portion P1-DD in the second direction DR2.

According to an embodiment, although the first light conversion pattern WCP1 and the second light conversion pattern WCP2, which are sequentially arranged to allow the second sub-portion PP2 and the fourth sub-portion PP4 to face each other, are repeatedly arranged, the third color light, the first color light, and the second color light may be sequentially provided along the first direction DR1 from a leftmost pixel among the pixels PX11 to PXnm since the first dummy light conversion pattern WCP1-DD that does not provide the light and the second dummy light conversion pattern WCP2-DD that provides the third color light are provided to the leftmost side. In an embodiment, for example, the red light, the green light, and the blue light may be sequentially emitted along the first direction DR1 from the leftmost pixel among the pixels PX11 to PXnm, and accordingly, the pixel areas may be arranged according to an order in which signals are provided from corresponding gate lines GL1 to GLn (refer to FIG. 4).

FIGS. 7A to 7G are cross-sectional views of a method of manufacturing a light control member according to an embodiment of the disclosure. In FIGS. 7A to 7G, the same reference numerals denote the same/similar elements as those described above with reference to FIGS. 1 to 6C, and thus, any repetitive detailed descriptions of the same/similar elements will be omitted or simplified.

Figures 7A, 7B:
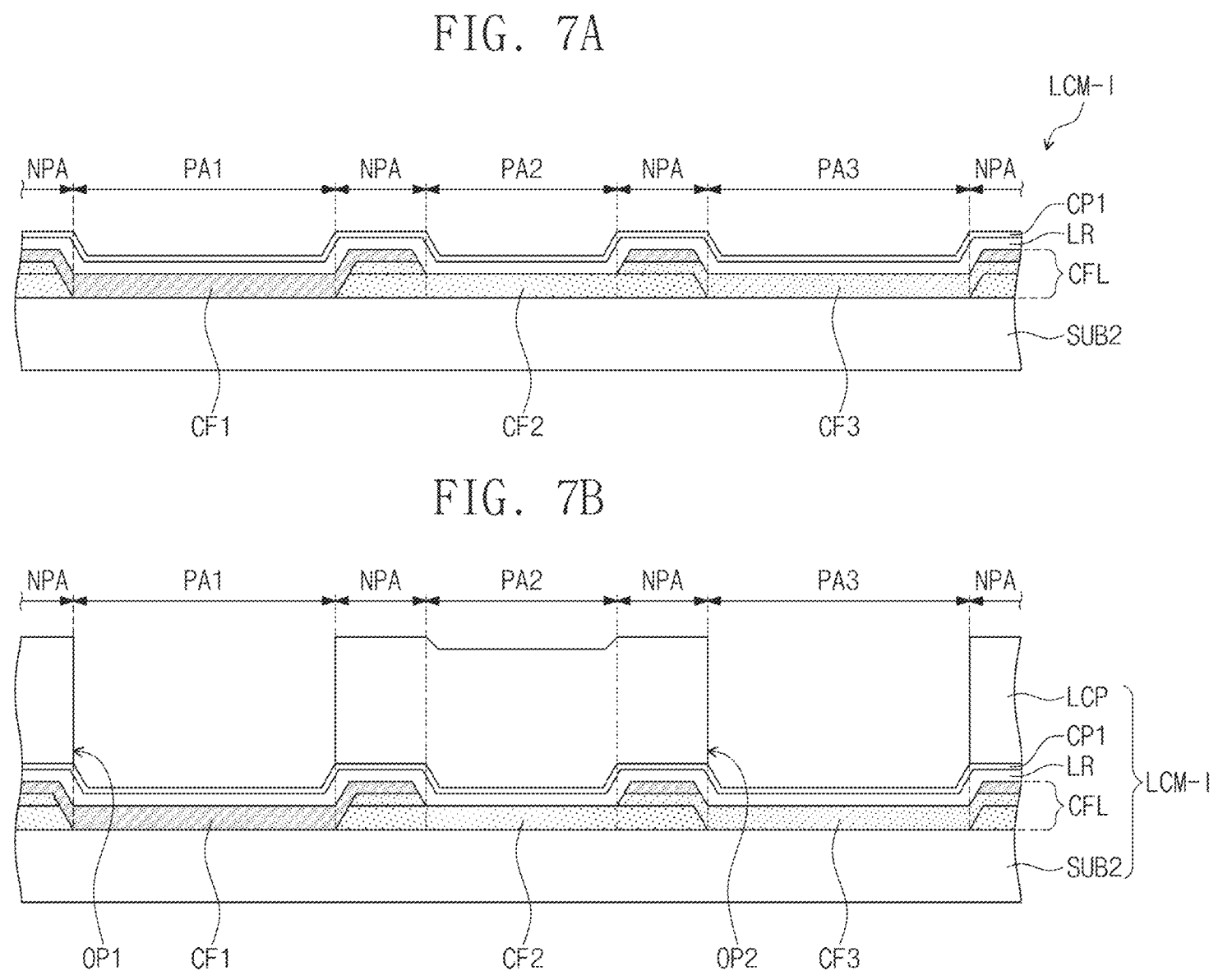

Referring to FIG. 7A, an embodiment of the manufacturing method of the light control member may include providing or preparing a preliminary light control member LCM-I.

The preliminary light control member LCM-I may include the base substrate SUB2, the color filter layer CFL disposed on one surface of the base substrate SUB2, the low refractive index layer LR disposed on the color filter layer CFL, and the first capping layer CP1 covering the low refractive index layer LR.

The color filter layer CFL may include the second color filter CF2, the third color filter CF3, and the first color filter CF1, which are sequentially formed. Accordingly, the second color filter CF2, the third color filter CF3, and the first color filter CF1 may be sequentially stacked in the light blocking area NPA.

Referring to FIG. 7B, the manufacturing method of the light control member may include forming the light control pattern LCP.

The light control pattern LCP may be formed on the preliminary light control member LCM-I. The light control pattern LCP may be formed by coating the base resin on the first capping layer CP1 using a coating, depositing, or printing process to form a preliminary light control layer and by pattering the preliminary light control layer using a photolithography process.

In an embodiment, portions of the preliminary light control layer, which overlap the first pixel area PA1 and the first area A1 (refer to FIG. 5B) of the light blocking area NPA adjacent to the first pixel area PA1, are removed to form the first opening OP1 and portions of the preliminary light control layer, which overlap the third pixel area PA3 and the second area A2 (refer to FIG. 5B) of the light blocking area NPA adjacent to the third pixel area PA3, are removed to form the second opening OP2, such that the patterned light control pattern LCP may be formed.

When viewed in the cross-section from the second direction DR2, the first opening OP1 may be formed to have a width equal to or greater than that of the first pixel area PA1, and the second opening OP2 may be formed to have a width equal to or greater than that of the third pixel area PA3.

According to an embodiment of the disclosure, as the light control pattern LCP is formed through the photolithography process using one mask, a portion overlapping the light blocking area NPA and a portion overlapping the second pixel area PA2 may be formed integrally with each other. Accordingly, the light control pattern LCP having both functions of a barrier wall and a light transmissive member may be formed without using an additional mask or forming a separate barrier wall. Thus, the manufacturing process of the display device DD (refer to FIG. 1) may be simplified.

The first and second dummy openings OP1-DD and OP2-DD described with reference to FIG. 6C may be formed through a same process as the patterning process to form the first and second openings OP1 and OP2.

Referring to FIGS. 7C to 7F, the manufacturing method of the light control member may include forming the first and second light conversion patterns WCP1 and WCP2.

The forming of the first and second light conversion patterns WCP1 and WCP2 may include forming the first light conversion pattern WCP1 through a first inkjet process and forming the second light conversion pattern WCP2 through a second inkjet process.

Figure 7C:
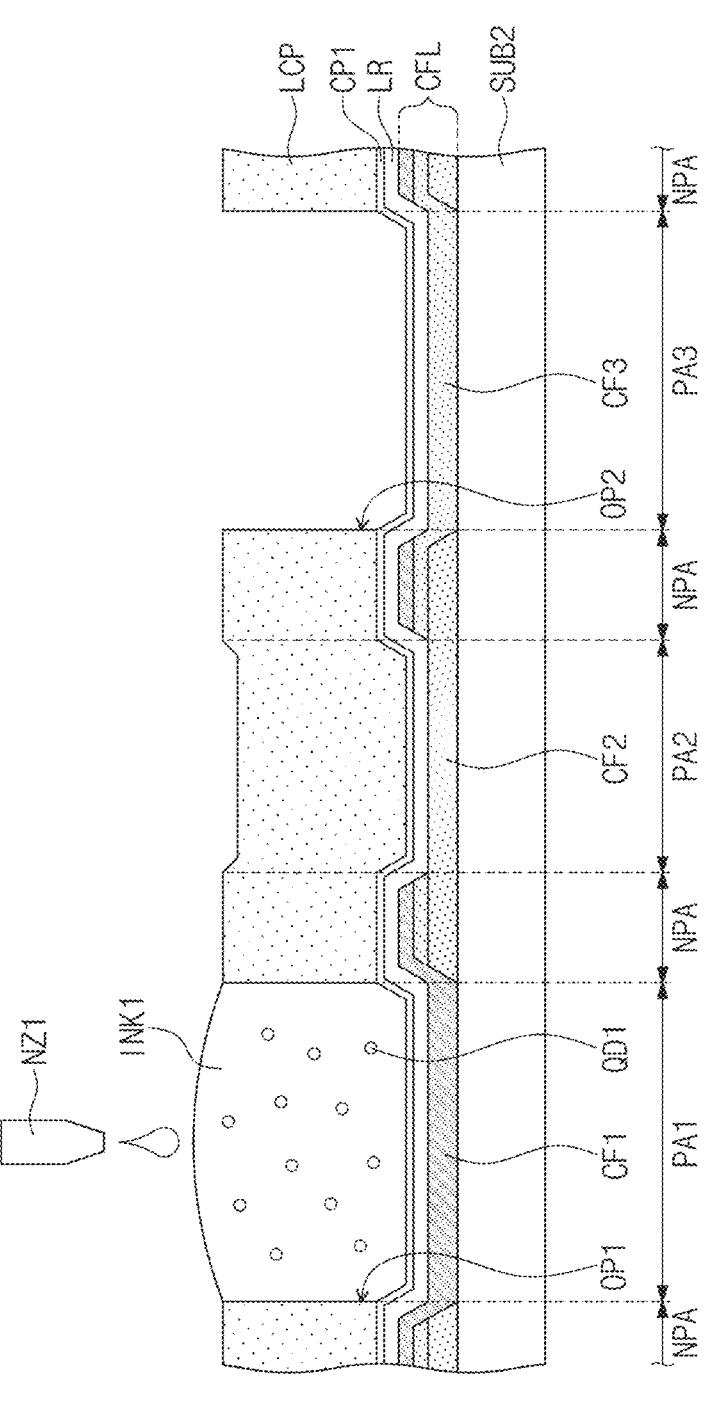
Figure 7D:
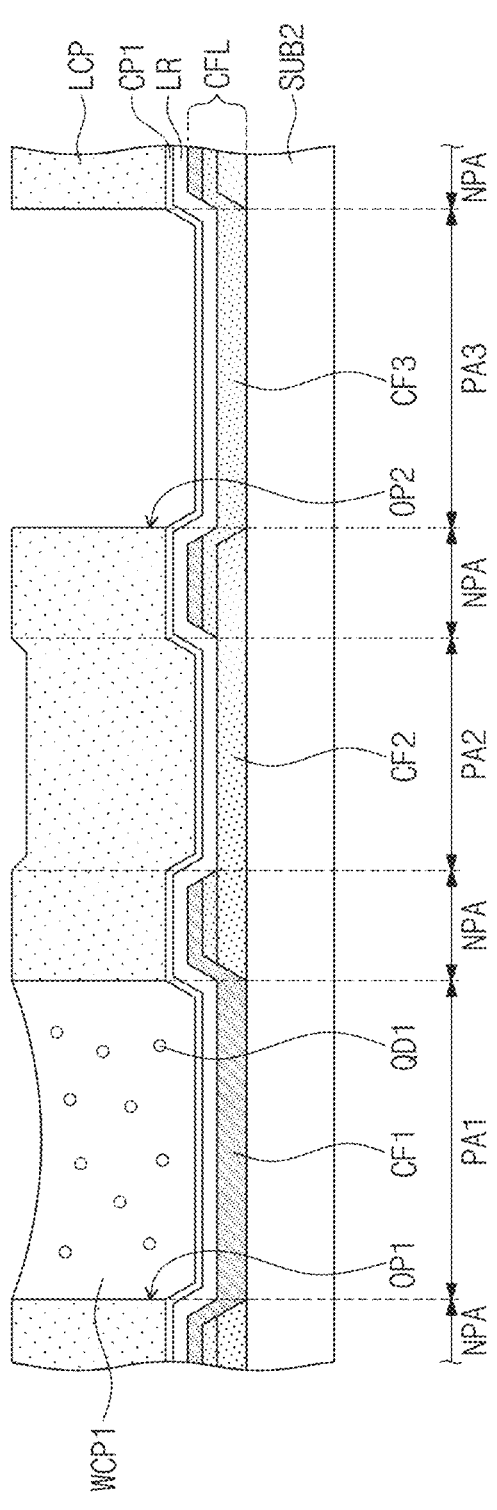

Referring to FIGS. 7C and 7D, the first light conversion pattern WCP1 may be formed through the first inkjet process.

A first nozzle NZ1 may be provided above the first opening OP1. The first nozzle NZ1 may spray a first ink INK1 into the first opening OP1. The first ink INK1 may include a composition constituting the first light conversion pattern WCP1. In an embodiment, for example, the first ink INK1 may include the base resin in which the first quantum dots QD1 are dispersed.

In an embodiment, As shown in FIG. 7C, the first ink INK1 may have a convex interface in a direction away from the color filter layer CFL immediately after being sprayed into the first opening OP1. Then, as shown in FIG. 7D, as a solvent of the first ink INK1 is evaporated, the first light conversion pattern WCP1 having an exposed surface concavely formed in a direction toward the color filter layer CFL may be formed. However, the shape of the first light conversion pattern WCP1 should not be particularly limited and may vary depending on a process condition.

According to an embodiment of the disclosure, in the first inkjet process, since the first opening OP1 is formed to overlap the first area A1 (refer to FIG. 5B) of the light blocking area NPA, the impact margin area with respect to the first ink INK1 may be provided. Accordingly, the error in impact position of the first ink INK1 may be reduced, and the process reliability of the first light conversion pattern WCP1 may be improved.

Figure 7E:
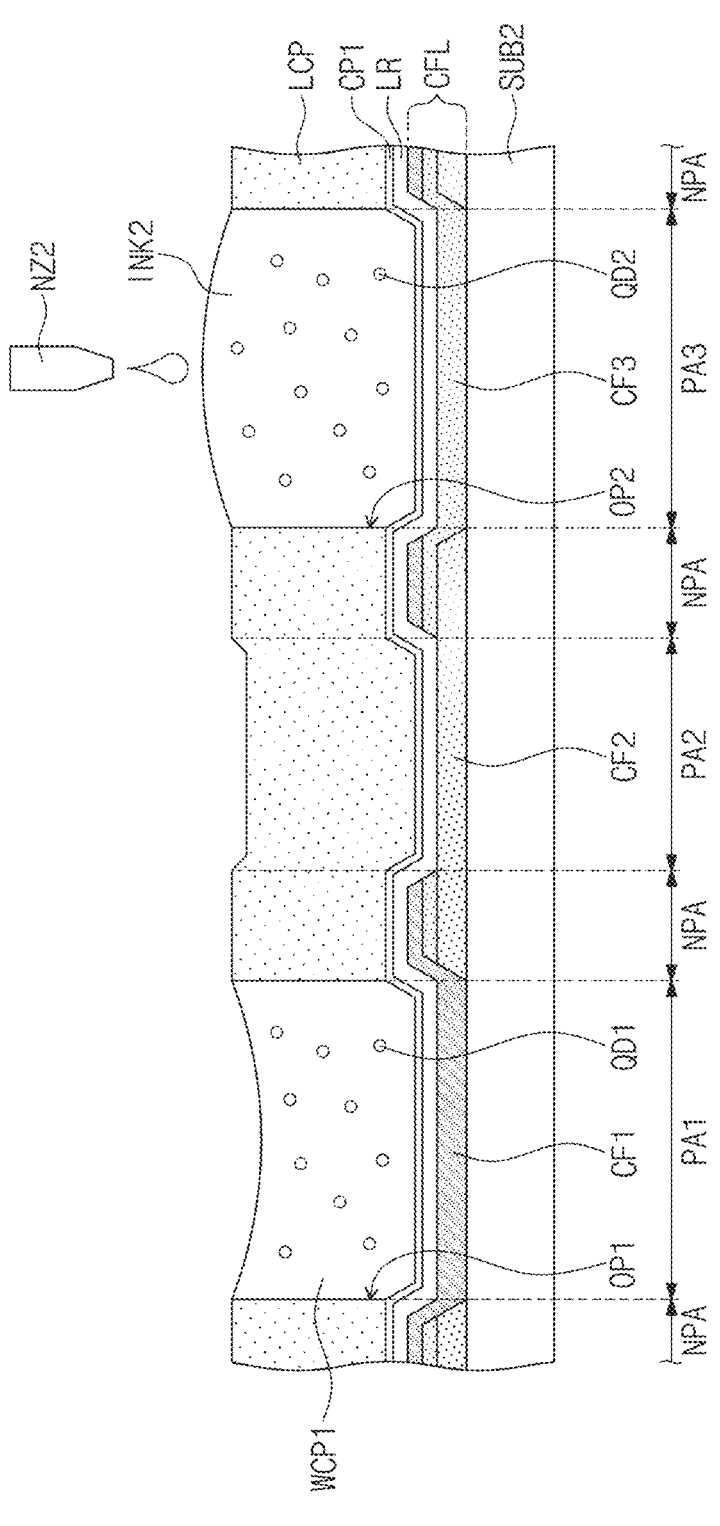
Figure 7F:
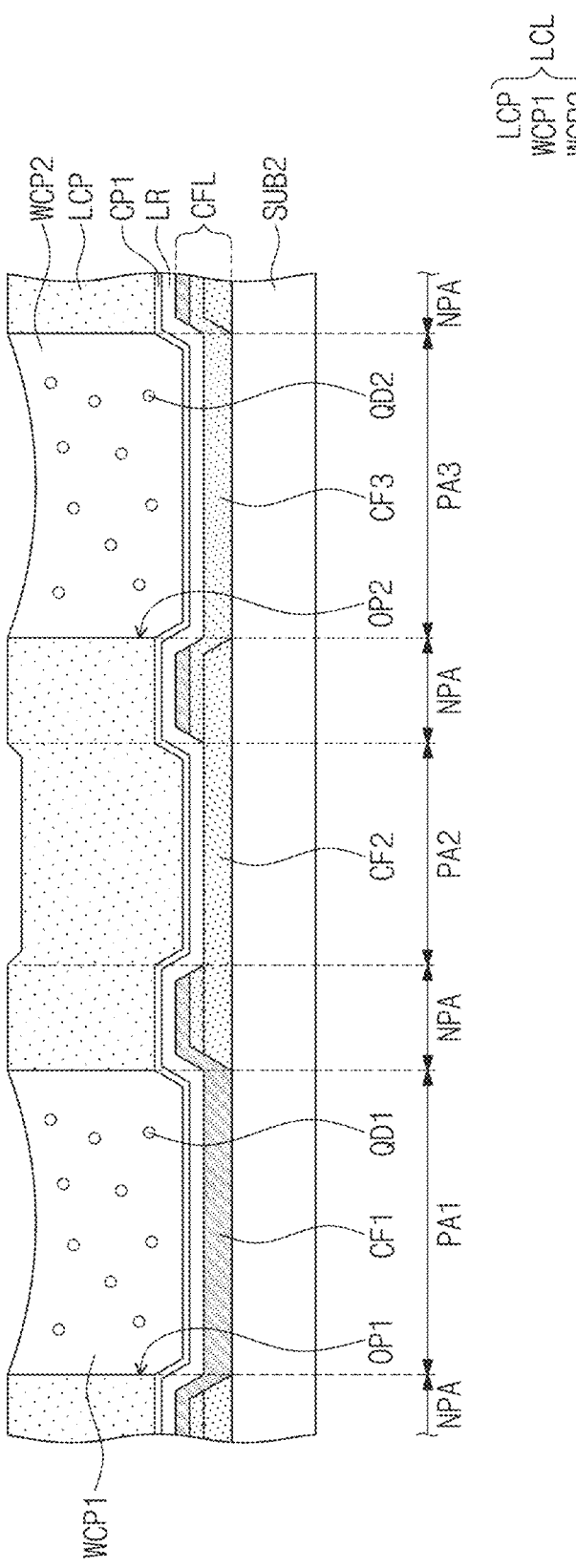

Referring to FIGS. 7E and 7F, the second light conversion pattern WCP2 may be formed through the second inkjet process.

A second nozzle NZ2 may be disposed above the second opening OP2. The second nozzle NZ2 may spray a second ink INK2 into the second opening OP2. The second ink INK2 may include a composition constituting the second light conversion pattern WCP2. In an embodiment, for example, the second ink INK2 may include the base resin in which the second quantum dots QD2 are dispersed.

As shown in FIG. 7E, the second ink INK2 may have a convex interface in the direction away from the color filter layer CFL immediately after being sprayed into the second opening OP2. Then, as shown in FIG. 7F, as a solvent of the second ink INK2 is evaporated, the second light conversion pattern WCP2 having an exposed surface concavely formed in the direction toward the color filter layer CFL may be formed. However, the shape of the second light conversion pattern WCP2 should not be particularly limited and may vary depending on a process condition.

According to an embodiment of the disclosure, in the second inkjet process, since the second opening OP2 is formed to overlap the second area A2 (refer to FIG. 5B) of the light blocking area NPA, the impact margin area with respect to the second ink INK2 may be provided. Accordingly, the error in impact position of the second ink INK2 may be reduced, and the process reliability of the second light conversion pattern WCP2 may be improved.

In such an embodiment, as described above, the light control layer LCL including the light control pattern LCP, the first light conversion pattern WCP1, and the second light conversion pattern WCP2 may be formed through the first and second inkjet processes.

The first dummy light conversion pattern WCP1-DD described with reference to FIG. 6C may be substantially simultaneously formed with first light conversion pattern WCP1 through the first inkjet process. In addition, the second dummy light conversion pattern WCP2-DD described with reference to FIG. 6C may be substantially simultaneously formed with the second light conversion pattern WCP2 through the second inkjet process.

Figure 7G:
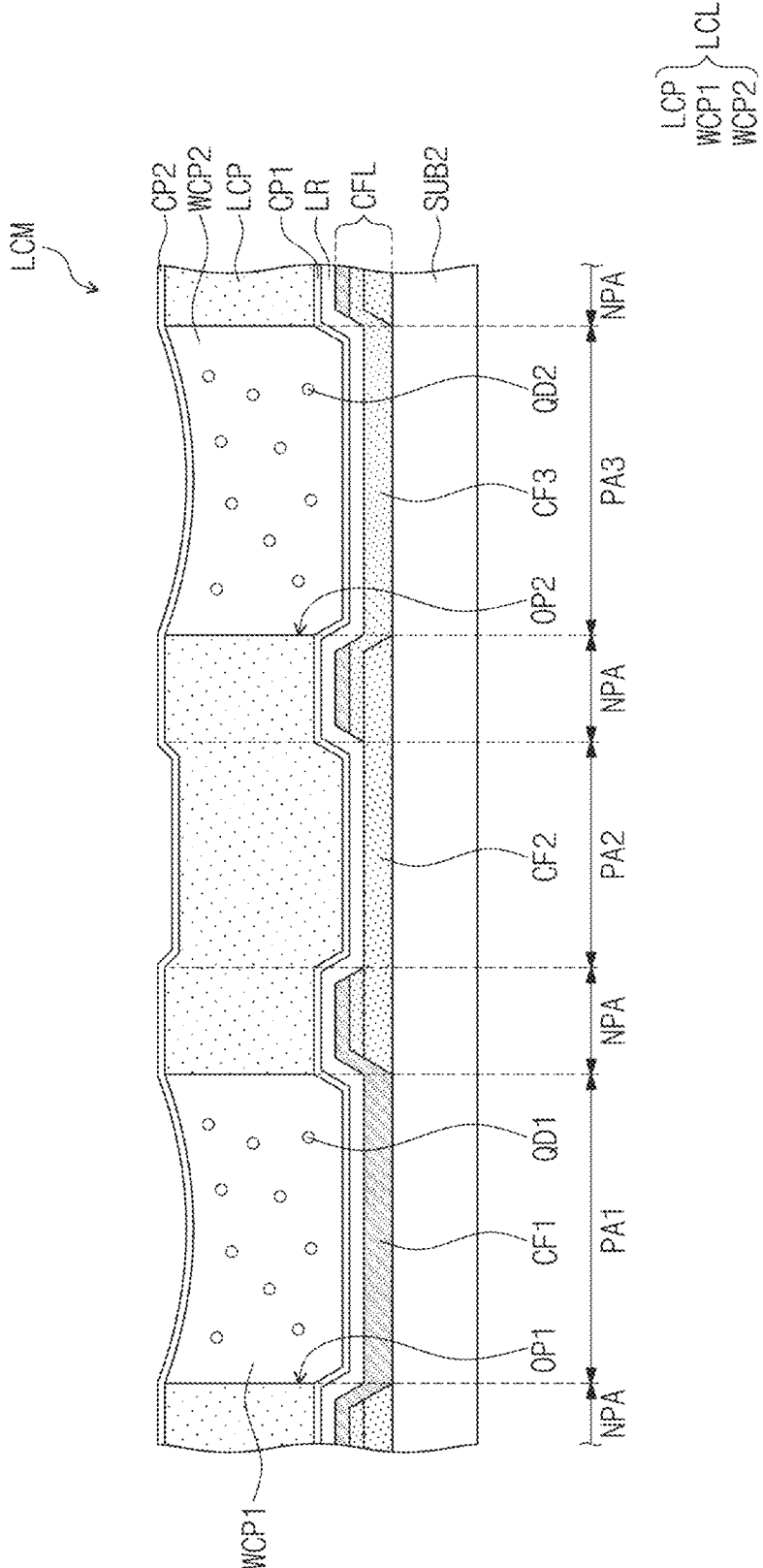

Referring to FIG. 7G, the manufacturing method of the light control member may further include forming the second capping layer CP2 on the light control layer LCL. The light control member LCM including the base substrate SUB2, the color filter layer CFL, the low refractive index layer LR, the first capping layer CP1, the light control layer LCL, and the second capping layer CP2 may be formed.

The light control member LCM formed through the manufacturing processes of FIGS. 7A to 7G may be coupled with the display panel DP (refer to FIG. 3), and thus, the display module DM (refer to FIG. 3) may be manufactured. The light control member LCM may be coupled with the display panel DP to allow the second capping layer CP2 of the light control member LCM to face the encapsulation layer TFE of the display panel CP.

Figure 8A:
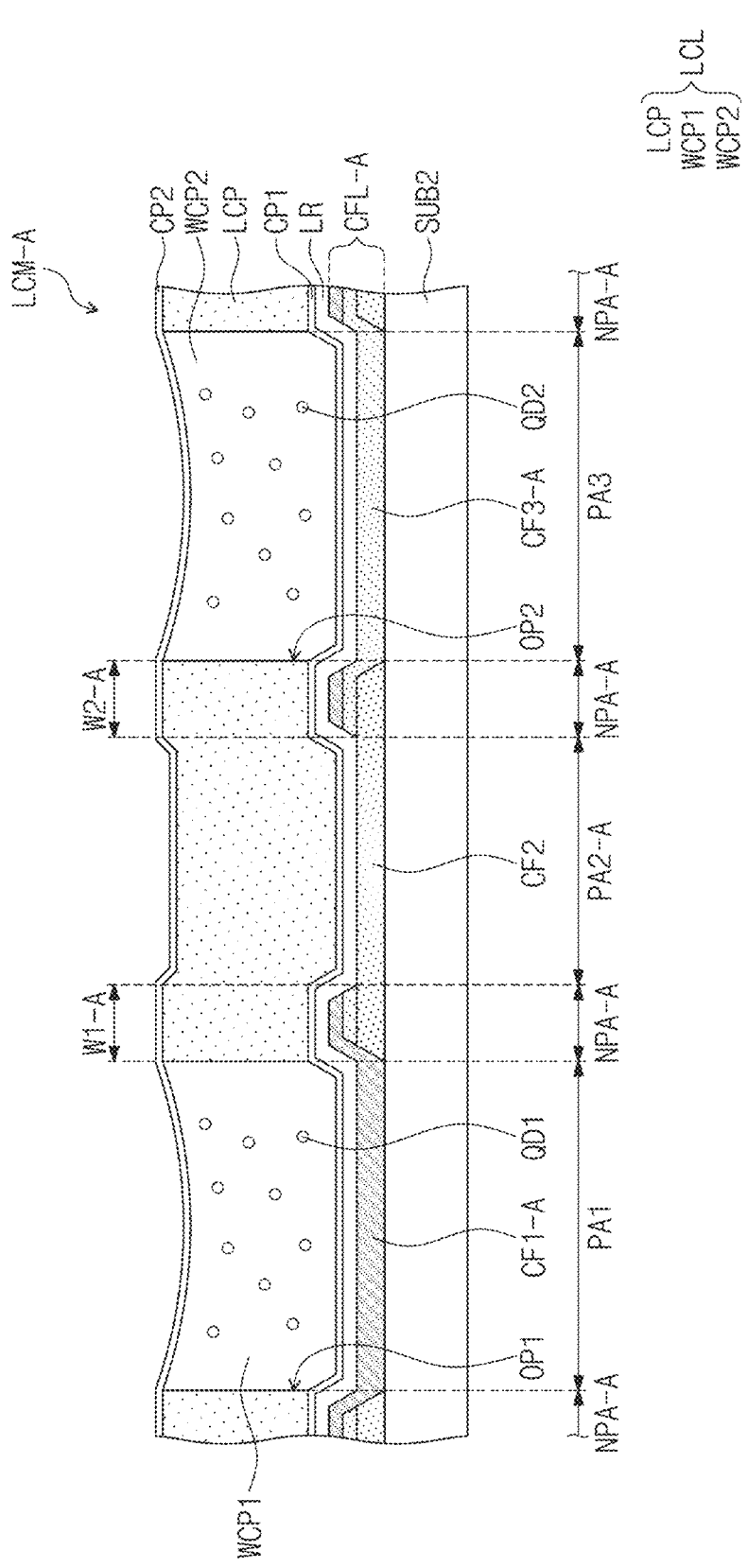
FIGS. 8A and 8B are cross-sectional views of a light control member according to embodiments of the disclosure.
Figure 8B:
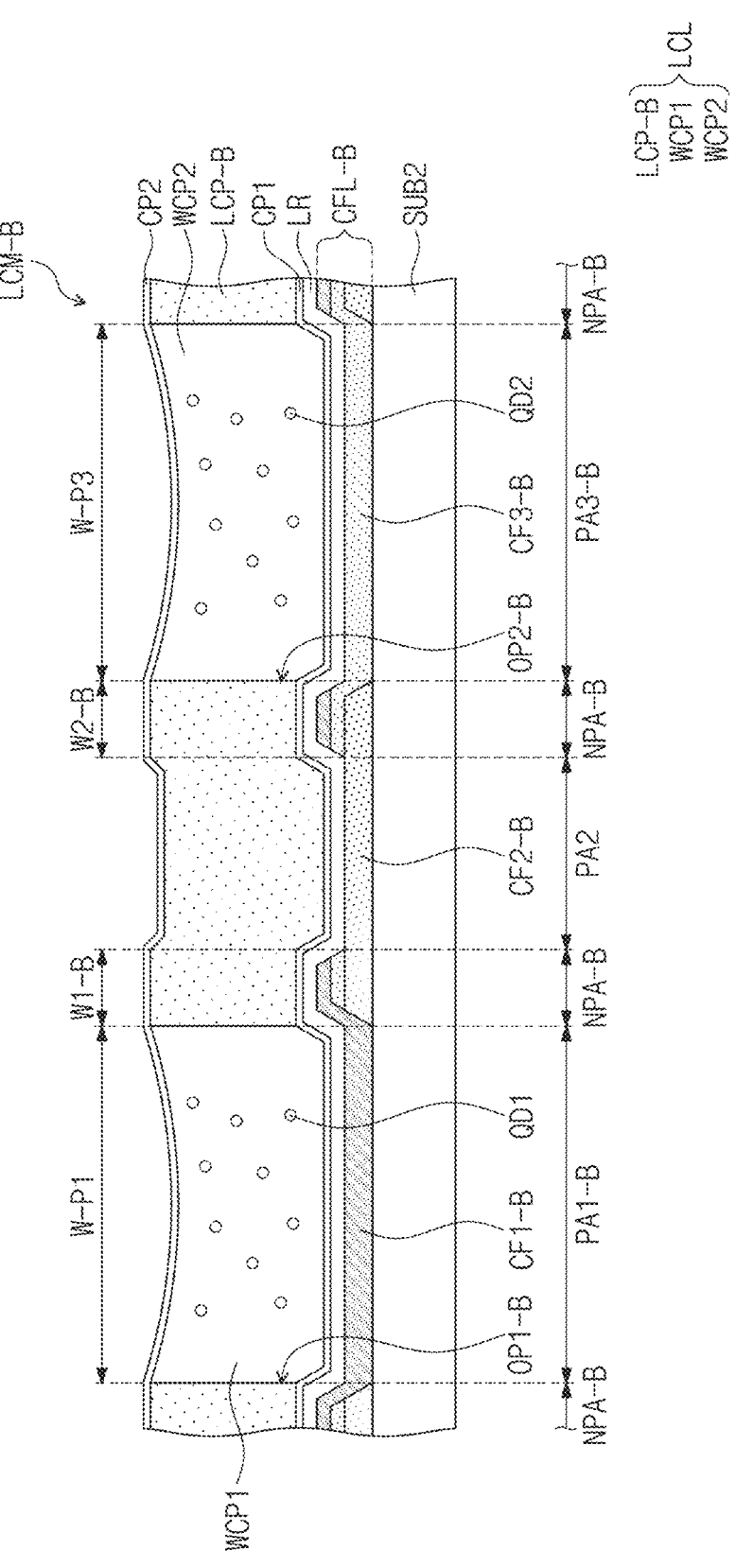

FIGS. 8A and 8B are cross-sectional views of a light control member according to embodiments of the disclosure. In FIGS. 8A and 8B, the same reference numerals denote the same/similar elements as those described above with reference to FIGS. 1 to 7G, and thus, any repetitive detailed descriptions of the same/similar elements will be omitted or simplified.

Referring to FIGS. 8A and 8B, as widths of light blocking areas NPA-A and NPA-B of color filter layers CFL-A and CFL-B and/or widths of first openings OP1 and OP1-B and second openings OP2 and OP2-B of light control patterns LCP and LCP-B are controlled, a width of each of first, second, and third pixel areas PA1, PA2-A, PA3, PA1-B, PA2, and PA3-B may be set.

In an embodiment of the light control member LCM-A of FIG. 8A, a width W1-A of the light blocking area NPA-A disposed between the first and second pixel areas PA1 and PA2-A adjacent to each other and a width W2-A of the light blocking area NPA-A disposed between the second and third pixel areas PA2-A and PA3 adjacent to each other may be reduced when compared with those of the light control member LCM of FIG. 7G, and thus, the width of the second pixel area PA2-A may increase.

In an embodiment, for example, as an opening of each of first and third color filters CF1-A and CF3-A overlapping the second pixel area PA2-A increases, the widths W1-A and W2-A of the light blocking area NPA may be reduced. That is, according to an embodiment, the second pixel area PA2-A may be easily expanded only by changing a design of the color filter layer CFL-A without changing a design of the light control layer LCL.

In an embodiment of the light control member LCM-B of FIG. 8B, a width W1-B of the light blocking area NPA-B disposed between the first and second pixel areas PA1-B and PA2 adjacent to each other and a width W2-B of the light blocking area NPA-B disposed between the second and third pixel areas PA2 and PA3-B adjacent to each other may be reduced when compared with those of the light control member LCM of FIG. 7G, and a width W-P1 of the first opening OP1-B and a width W-P3 of the second opening OP2-B may increase. Thus, widths of the first and third pixel areas PA1-B and PA3-B may increase.

In an embodiment, for example, as the opening of each of the second and third color filters CF2-B and CF3-B overlapping the first pixel area PA1-B and the opening of each of the first and second color filters CF1-B and CF2-B overlapping the third pixel area PA3-B increase, the width of the light blocking area NPA-B may be reduced.

According to an embodiment, when a width of a portion of the light control pattern LCP-B, which is disposed between the first portion P1 (refer to FIG. 5B) of the first light conversion pattern WCP1 and the third portion P3 (refer to FIG. 5B) of the second light conversion pattern WCP2, is reduced, the width of each of the first and second openings OP1-B and OP2-B may increase.

According to an embodiment of the disclosure, since the light control pattern LCP-B overlapping the second pixel area PA2 may serve as a barrier wall to define a boundary between the first and second light conversion patterns WCP1 and WCP-2, the error in impact position of the ink may be effectively prevented from occurring even though the width of the light control pattern LCP-B between the first portion P1 (refer to FIG. 5B) and the third portion P3 (refer to FIG. 5B) is reduced. Accordingly, the process reliability of the light control member LCM-B may be maintained, the size of the first, second, and third pixel areas PA1-B, PA2, and PA3-B may increase, and the light emitting efficiency of the display device DD (refer to FIG. 1) may increase.

Figure 9:
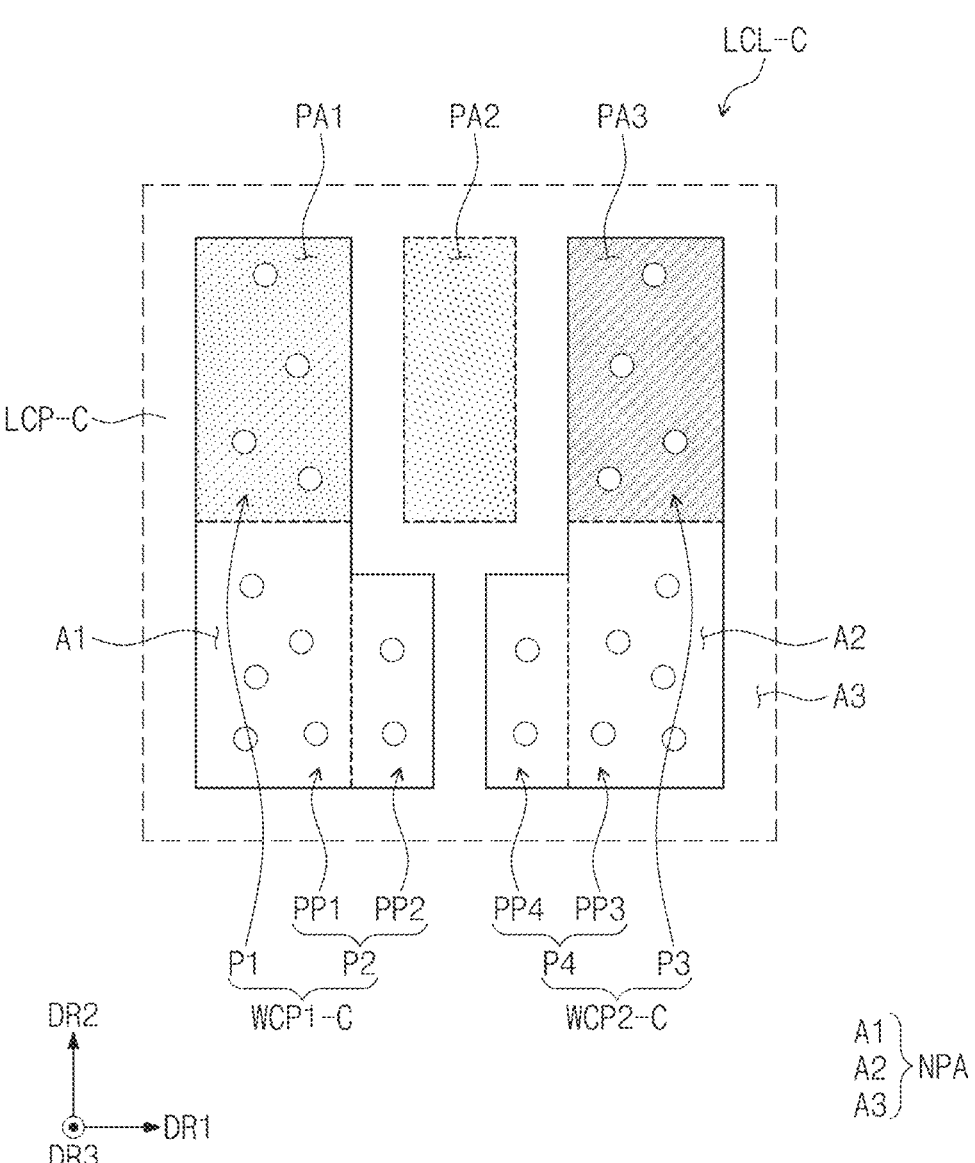
FIGS. 9, 10A, and 10B are enlarged plan views of a display area according to embodiments of the disclosure.
Figure 10A:
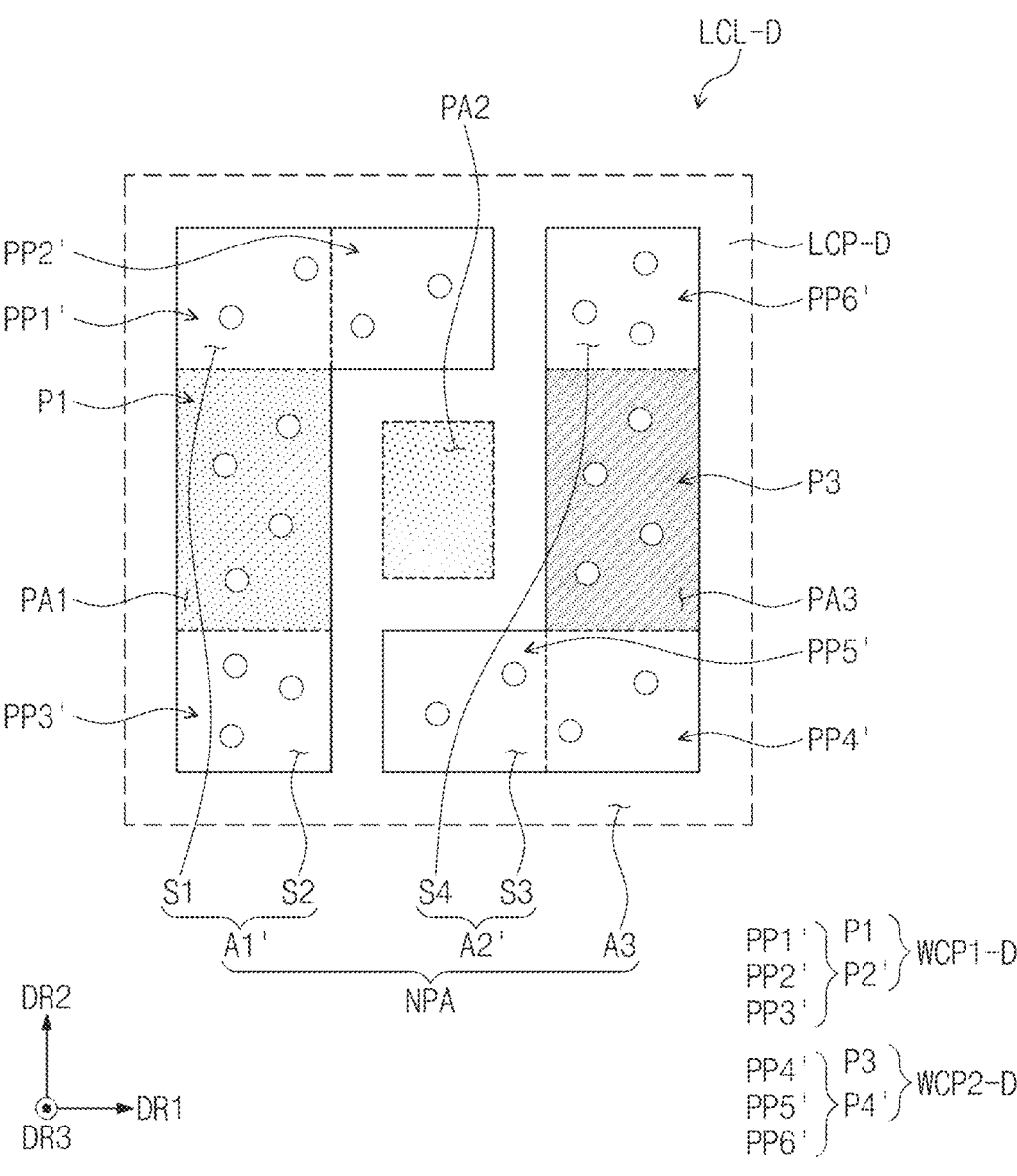
Figure 10B:
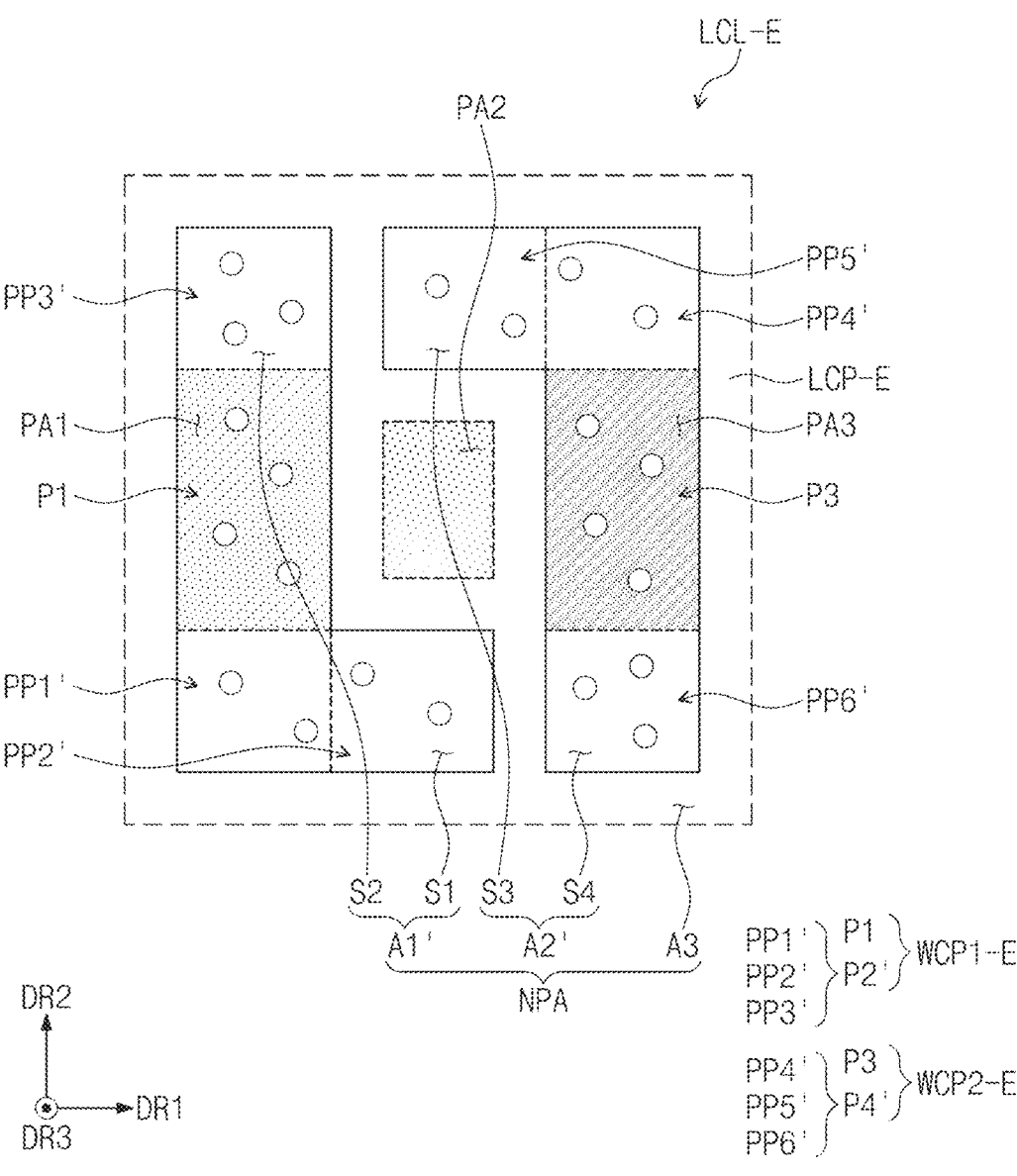

FIGS. 9, 10A, and 10B are enlarged plan views of a display area according to embodiments of the disclosure.

FIGS. 9, 10A, and 10B show first and second light conversion patterns WCP1-C, WCP1-D, WCP1-E, WCP2-C, WCP2-D, and WCP2-E having various shapes obtained by varying the shape of first and second openings OP1 and OP2 (refer to FIG. 5B) of light control patterns LCP-C, LCP-D, and LCP-E. FIGS. 9, 10A, and 10B are enlarged views each showing one of the first light conversion patterns WCP1-C, WCP1-D, and WCP1-E and one of the second light conversion patterns WCP2-C, WCP2-D, and WCP2-E, and for the convenience of illustration, areas corresponding to first, second, and third pixel areas PA1, PA2, and PA3 are hatched. In FIGS. 9, 10A, and 10B, the same reference numerals denote the same/similar elements as those described above with reference to FIGS. 1 to 7G, and thus, any repetitive detailed descriptions of the same/similar elements will be omitted or simplified.

Referring to FIG. 9, in an embodiment, a light control layer LCL-C may include the light control pattern LCP-C, the first light conversion pattern WCP1-C, and the second light conversion pattern WCP2-C. Details of the light control pattern LCP, the first light conversion pattern WCP1, and the second light conversion pattern WCP2 described with reference to FIGS. 5B, 6A, and 6B may be applied to the light control pattern LCP-C, the first light conversion pattern WCP1-C, and the second light conversion pattern WCP2-C, and thus, descriptions will be focused on different features.

The first light conversion pattern WCP1-C may have a shape in which a second portion P2 protrudes from a first portion P1 to a direction opposite to the second direction DR2. A first sub-portion PP1 may be a portion that protrudes from the first portion P1 to the direction opposite to the second direction DR2, and a second sub-portion PP2 may be a portion that protrudes from the first sub-portion PP1 to the first direction DR1.

The second light conversion pattern WCP2-C may have a shape in which a fourth portion P4 protrudes from a third portion P3 to the direction opposite to the second direction DR2. A third sub-portion PP3 may be a portion that protrudes from the third portion P3 to the direction opposite to the second direction DR2, and a fourth sub-portion PP4 may be a portion that protrudes from the third sub-portion PP3 to the direction opposite to the first direction DR1.

Referring to FIG. 10A, in an alternative embodiment, a light control layer LCL-D may include the light control pattern LCP-D, the first light conversion pattern WCP1-D, and the second light conversion pattern WCP2-D. In such an embodiment, the first and second light conversion patterns WCP1-D and WCP2-D may have a shape that is symmetrical with respect to a center of gravity of the second pixel area PA2.

The first light conversion pattern WCP1-D may include a first portion P1 overlapping the first pixel area PA1 and a second portion P2' overlapping a light blocking area NPA. The second portion P2' may overlap a first area A1' corresponding to a portion of the light blocking area NPA adjacent to the first pixel area PAL According to an embodiment, the first area A1' of the light blocking area NPA may include a first sub-area S1 that protrudes from the first pixel area PA1 to the second direction DR2 and a second sub-area S2 that protrudes from the first pixel area PA1 to the direction opposite to the second direction DR2.

The second portion P2' may include first and second sub-portions PP1' and PP2' overlapping the first sub-area S1 and a third sub-portion PP3' overlapping the second sub-area S2. The first and second sub-portions PP1' and PP2' may protrude from the first portion P1 to the second direction DR2, and the third sub-portion PP3' may protrude from the first portion P1 to the direction opposite to the second direction DR2.

The first sub-portion PP1' may be a portion that extends from the first portion P1 to the second direction DR2, and the second sub-portion PP2' may be a portion that extends from the first sub-portion PP1' to the first direction DR1. The third sub-portion PP3' may be a portion that extends from the first portion P1 to the direction opposite to the second direction DR2.

The second portion P2' may have a maximum width greater than a maximum width of the first portion P1. The maximum width of the second portion P2' may correspond to a sum of a width of the first sub-portion PP1' and a width of the second sub-portion PP2'. According to an embodiment, a width of the third sub-portion PP3' may be substantially the same as the width of the first portion P1, however, it should not be limited thereto or thereby.

When viewed in the second direction DR2, the second pixel area PA2 may overlap the first sub-area S1 of the light blocking area NPA. According to an embodiment, the entire second pixel area PA2 may overlap the first sub-area S1 of the light blocking area NPA.

The second light conversion pattern WCP2-D may include a third portion P3 overlapping the third pixel area PA3 and a fourth portion P4' overlapping the light blocking area NPA. The fourth portion P4' may overlap a second area A2' corresponding to another portion of the light blocking area NPA adjacent to the third pixel area PA3. According to an embodiment, the second area A2' of the light blocking area NPA may include a third sub-area S3 that protrudes from the third pixel area PA3 to the direction opposite to the second direction DR2 and a fourth sub-area S4 that protrudes from the third pixel area PA3 to the second direction DR2.

The fourth portion P4' may include fourth and fifth sub-portions PP4' and PP5' overlapping the third sub-area S3 and a sixth sub-portion PP6' overlapping the fourth sub-area S4. The fourth and fifth sub-portions PP4' and PP5' may be portions that protrude from the third portion P3 to the direction opposite to the second direction DR2, and the sixth sub-portion PP6' may be a portion that protrudes from the third portion P3 to the second direction DR2.

The fourth sub-portion PP4' may be a portion that extends from the third portion P3 to the direction opposite to the second direction DR2, and the fifth sub-portion PP5' may be a portion that extends from the fourth sub-portion PP4' to the direction opposite to the first direction DR1. The sixth sub-portion PP6' may be a portion that extends from the third portion P3 to the second direction DR2. The fifth sub-portion PP5' may face the third sub-portion PP3' in the first direction DR1, and the sixth sub-portion PP6' may face the second sub-portion PP2' in the first direction DR1.

The fourth portion P4' may have a maximum width corresponding to a sum of a width of the third sub-portion PP3' and a width of the fourth sub-portion PP4'. The maximum width of the fourth portion P4' may be greater than a maximum width of the third portion P3. According to an embodiment, the width of the third sub-portion PP3' may be substantially the same as the width of the second portion P2', however, it should not be limited thereto or thereby.

When viewed in the second direction DR2, the second pixel area PA2 may overlap the third sub-area S3 of the light blocking area NPA. According to an embodiment, the entire second pixel area PA2 may overlap the third sub-area S3 of the light blocking area NPA.

Referring to FIG. 10B, in an alternative embodiment, a light control layer LCL-E may include the light control pattern LCP-E, the first light conversion pattern WCP1-E, and the second light conversion pattern WCP2-E. The first and second light conversion patterns WCP1-E and WCP2-E may have a shape that is symmetrical with respect to a center of gravity of the second pixel area PA2 when viewed in the plan view. In FIG. 10B, the same reference numerals denote the same/similar elements as those described above with reference to FIG. 10A. Thus, any repetitive detailed descriptions of the same/similar elements will be omitted or simplified, and descriptions will be focused on different features.

The first light conversion pattern WCP1-E may have a shape in which first and second sub-portions PP1' and PP2' protrude from a first portion P1 to the direction opposite to the second direction DR2 and a third sub-portion PP3' protrudes from the first portion P1 to the second direction DR2.

The first sub-portion PP1' may be a portion that extends from the first portion P1 to the direction opposite to the second direction DR2, and the third sub-portion PP3' may be a portion that extends from the first portion P1 to the second direction DR2.

The second light conversion pattern WCP2-E may have a shape in which fourth and fifth sub-portions PP4' and PP5' protrude from a third portion P3 to the second direction DR2 and a sixth sub-portion PP6' protrudes from the third portion P3 to the direction opposite to the second direction DR2.

The fourth sub-portion PP4' may be a portion that extends from the third portion P3 to the second direction DR2, and the sixth sub-portion PP6' may be a portion that extends from the third portion P3 to the direction opposite to second direction DR2.

Figure 11:
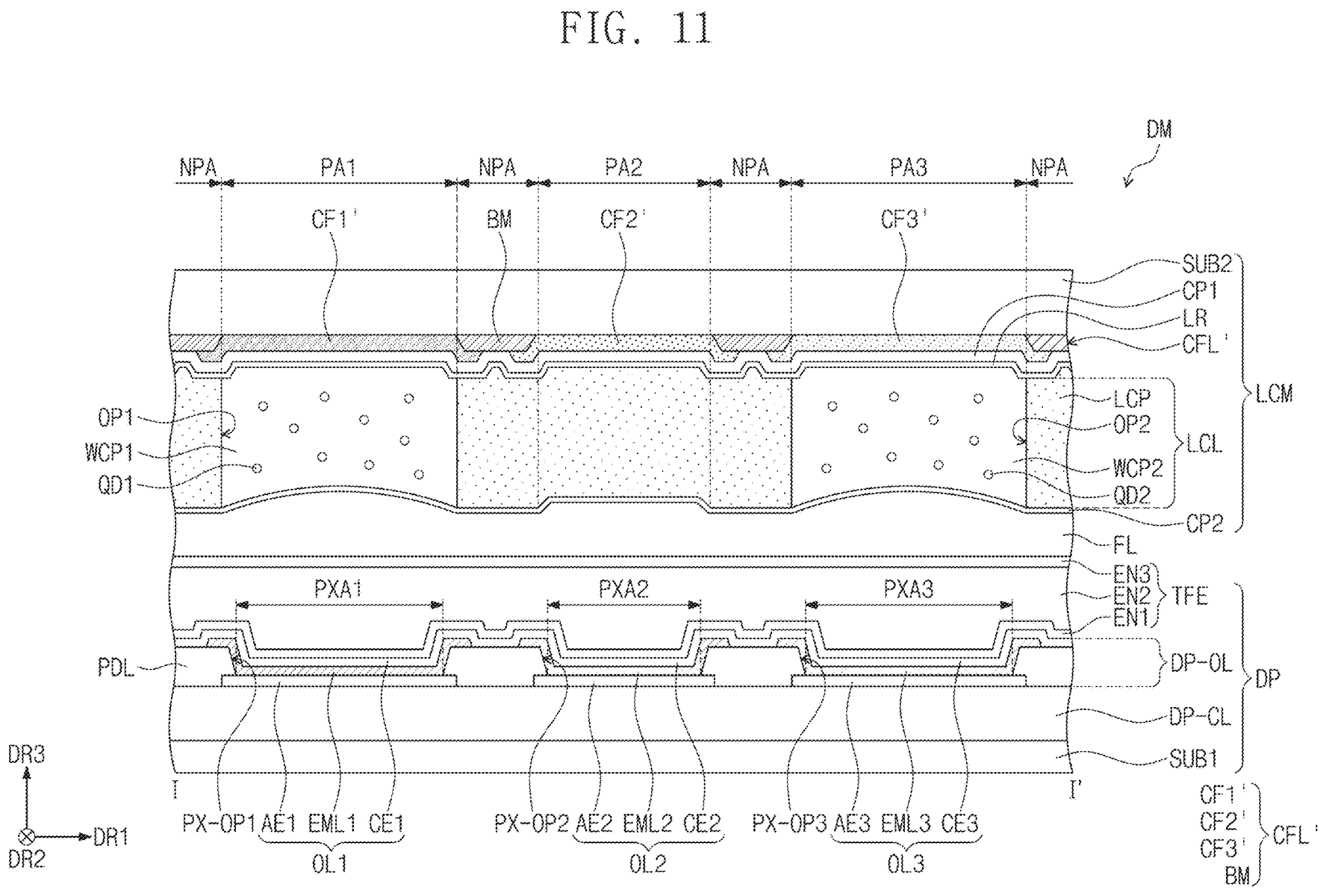

FIG. 11 is a cross-sectional view of a display module DM according to an embodiment of the disclosure. The light control member LCM of FIG. 11 is substantially the same as the light control member LCM of FIGS. 6A to 6C except for a color filter layer CFL'. In FIG. 11, the same/similar reference numerals denote the same/similar elements as those described above with reference to FIGS. 1 to 6C, and thus, any repetitive detailed descriptions of the same/similar elements will be omitted or simplified.

Referring to FIG. 11, the color filter layer CFL' may include first, second, and third color filters CF1', CF2', and CF3' and a light blocking pattern BM. According to an embodiment, a light blocking area NPA may be defined as an area in which the light blocking pattern BM is disposed. The light blocking pattern BM may include a light absorbing material. In an embodiment, for example, the light blocking pattern BM may include a black coloring agent. The black coloring agent may include a black dye or a black pigment. The black coloring agent may include a metal material, such as carbon black, chrome, etc., or an oxide thereof.

According to an embodiment, the first, second, and third color filters CF1', CF2' and CF3' may be arranged to form (or defined by) a single layer. That is, the first, second, and third color filters CF1', CF2', and CF3' may be arranged in the light blocking area NPA not to overlap each other when viewed in the third direction DR3, however, they should not be limited thereto or thereby. According to an embodiment, two or more color filters among the first, second, and third color filters CF1', CF2', and CF3' may be stacked on the light blocking pattern BM.

Figure 12:
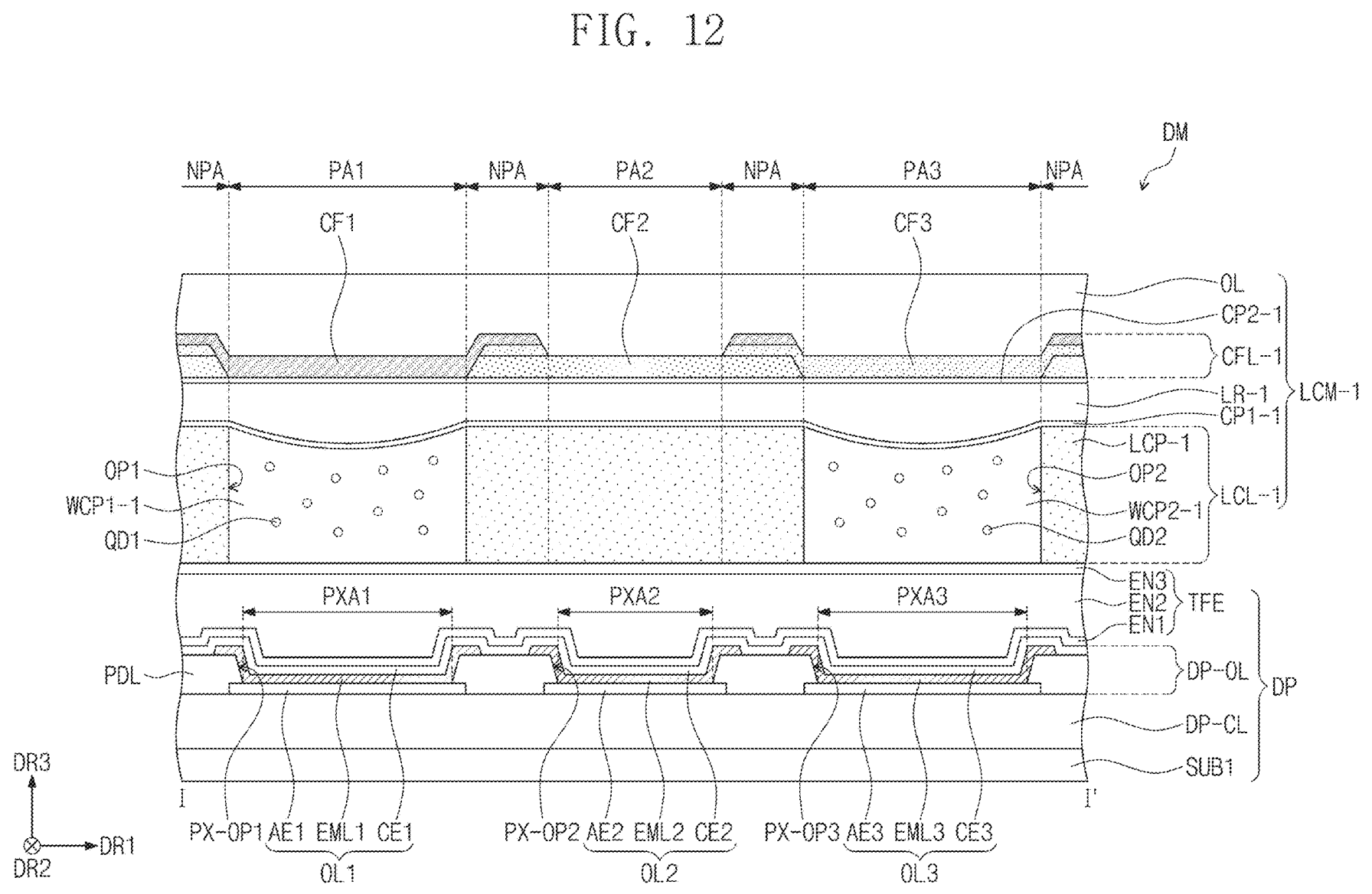

FIG. 12 is a cross-sectional view of a display module DM according to an embodiment of the disclosure. In FIG. 12, the same/similar reference numerals denote the same/similar elements as those described above with reference to FIGS. 1 to 6C, and thus, any repetitive detailed descriptions of the same/similar elements will be omitted or simplified.

Referring to FIG. 12, in an embodiment, a light control member LCM-1 may include a light control layer LCL-1, a first capping layer CP1-1, a low refractive index layer LR-1, a second capping layer CP2-1, a color filter layer CFL-1, and a planarization layer OL. According to an embodiment, the light control member LCM-1 may be formed on a display panel DP through successive processes. Accordingly, the light control layer LCL-1, the first capping layer CP1-1, the low refractive index layer LR-1, the second capping layer CP2-1, the color filter layer CFL-1, and the planarization layer OL may be sequentially stacked on an encapsulation layer TFE along the third direction DR3, and the successive processes may be performed in the same order as the stacked order. In addition, as the light control member LCM-1 is directly formed on the encapsulation layer TFE, the light control member LCM-1 may not include a separate base substrate.

The light control layer LCL-1 may be disposed directly on the encapsulation layer TFE. The light control layer LCL-1 may include a light control pattern LCP-1, a first light conversion pattern WCP1-1, and a second light conversion pattern WCP2-1. The light control pattern LCP-1 may be disposed on the encapsulation layer TFE that is flat, and an upper surface of the light control pattern LCP-1 may be flat without including a step difference portion.

When the first and second inkjet processes described with reference to FIGS. 7C to 7F are performed on the light control pattern LCP-1 formed on the display panel DP, each of the first and second light conversion patterns WCP1-1 and WCP2-1 may include an exposed surface concavely formed in a direction approaching the display panel DP.

The first capping layer CP1-1 may be disposed on the light control layer LCL-1 to cover the light control pattern LCP-1, the first light conversion pattern WCP1-1, and the second light conversion pattern WCP2-1. The first capping layer CP1-1 may prevent moisture or a foreign substance from entering the light control layer LCL-1 to protect the light control layer LCL-1.

The low refractive index layer LR-1 may be disposed on the first capping layer CP1-1. The second capping layer CP2-1 may be disposed on the low refractive index layer LR-1 and may cover the low refractive index layer LR-1. The second capping layer CP2-1 may prevent moisture or gas from entering the low refractive index layer LR-1 to protect the low refractive index layer LR-1.

The color filter layer CFL-1 may be disposed on the second capping layer CP2-1. According to an embodiment, the color filter layer CFL-1 may include first, second, and third color filters CF1-1, CF2-1, and CF3-1, and at least two color filters among the first, second, and third color filters CF1-1, CF2-1, and CF3-1 may be stacked in the third direction DR3 to define a light blocking area NPA, however, they should not be limited thereto or thereby. According to an alternative embodiment, the display module DM may further include a light blocking pattern BM (refer to FIG. 11), and the light blocking area NPA may be defined by the light blocking pattern BM (refer to FIG. 11).

The planarization layer OL may be disposed on the color filter layer CFL-1 and may cover the color filter layer CFL-1. The planarization layer OL may provide a flat upper surface of the display module DM. Various functional layers may be further provided on the planarization layer OL. The functional layers may include, for example, a protective layer, an anti-fingerprint layer, an anti-static layer, etc.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a base layer;
light emitting elements disposed on the base layer, wherein each of the light emitting elements emits a source light;
a color filter layer comprising first, second, and third pixel areas respectively corresponding to the light emitting elements and arranged in a first direction, and a light blocking area surrounding the first, second, and third pixel areas;
a light control pattern overlapping the second pixel area, wherein a first opening is defined through the light control pattern to overlap the first pixel area and a portion of the light blocking area, and a second opening is defined through the light control pattern to overlap the third pixel area and another portion of the light blocking area;
a first light conversion pattern disposed in the first opening, wherein the first light conversion pattern comprises a first quantum dot; and
a second light conversion pattern disposed in the second opening, wherein the second light conversion pattern comprises a second quantum dot,
wherein the first light conversion pattern includes:
a first portion overlapping the first pixel area; and
a second portion overlapping the portion of the light blocking area and protruding from the first portion when viewed in a plan view,
wherein the second light conversion pattern includes:
a third portion overlapping the third pixel area; and
a fourth portion overlapping the another portion of the light blocking area and protruding from the third portion when viewed in the plan view.

2. The display device of claim 1, wherein the second portion has a width greater than a width of the first portion in the first direction.

3. The display device of claim 1, wherein the fourth portion has a width greater than a width of the third portion in the first direction.

4. The display device of claim 1, wherein a minimum separation distance between the second portion and the fourth portion is smaller than a minimum separation distance between the first portion and the third portion when viewed in the plan view.

5. The display device of claim 1, wherein the second portion protrudes from the first portion in a second direction substantially perpendicular to the first direction, and the fourth portion protrudes from the third portion in the second direction.

6. The display device of claim 1, wherein the second portion comprises:
a first sub-portion extending from the first portion in a second direction substantially perpendicular to the first direction; and a second sub-portion extending from the first sub-portion in the first direction.

7. The display device of claim 6, wherein the fourth portion comprises:

a third sub-portion extending from the third portion in the second direction; and a fourth sub-portion extending from the third sub-portion in a direction opposite to the first direction and facing the second sub-portion in the first direction.

8. The display device of claim 6, wherein the second portion further comprises a third sub-portion extending from the first portion in a direction opposite to the second direction.

9. The display device of claim 8, wherein the fourth portion comprises:

a fourth sub-portion extending from the third portion in the direction opposite to the second direction;

a fifth sub-portion extending from the fourth sub-portion in a direction opposite to the first direction and facing the third sub-portion in the first direction; and a sixth sub-portion extending from the third portion in the second direction and facing the second sub-portion in the first direction.

10. The display device of claim 1, wherein the first and second light conversion patterns have a shape which is symmetrical with respect to one of a center line of the second pixel area or a center of gravity of the second pixel area when viewed in the plan view.

11. The display device of claim 1, wherein the light control pattern comprises a photosensitive resin.

12. The display device of claim 1, wherein the light control pattern transmits the source light.

13. The display device of claim 1, wherein the color filter layer comprises first, second, and third color filters, only the first color filter is disposed in the first pixel area, only the second color filter is disposed in the second pixel area, and only the third color filter is disposed in the third pixel area.

14. The display device of claim 13, wherein at least two color filters among the first, second, and third color filters are stacked in the light blocking area.

15. The display device of claim 13, wherein the color filter layer further comprises a light blocking pattern overlapping the light blocking area, wherein the light blocking pattern comprises a light blocking material.

16. The display device of claim 1, wherein each of the first pixel area, the second pixel area, and the third pixel area is provided in plural, first, second, and third pixel areas are alternately arranged in the first direction, each of the first light conversion pattern and the second light conversion pattern is provided in plural, first light conversion patterns respectively correspond to the first pixel areas, second light conversion patterns respectively correspond to the third pixel areas, and the first light conversion patterns are alternately arranged with the second light conversion patterns in the first direction.

17. The display device of claim 16, further comprising:

a first dummy light conversion pattern spaced apart from the first and second light conversion patterns in the first direction, wherein the first dummy light conversion pattern comprises the first quantum dot; and a second dummy light conversion pattern disposed between the first dummy light conversion pattern and the first light conversion patterns, wherein the second dummy light conversion pattern comprises the second quantum dot, wherein the color filter layer further comprises a dummy pixel area spaced apart from the first, second, and third pixel areas in the first direction and surrounded by the light blocking area, wherein the dummy pixel area emits a light having substantially a same color as a light emitted from the third pixel area, and the first dummy light conversion pattern overlaps the light blocking area.

18. The display device of claim 17, wherein the second dummy light conversion pattern comprises:

a first dummy portion overlapping the dummy pixel area; and a second dummy portion overlapping the light blocking area and protruding from the first dummy portion when viewed in the plan view.

19. The display device of claim 17, further comprising:

a dummy light emitting element overlapping the second dummy light conversion pattern, wherein the first dummy light conversion pattern does not overlap the light emitting elements and the dummy light emitting element.

20. The display device of claim 17, wherein the first dummy light conversion pattern has substantially a same shape as the first light conversion pattern when viewed in the plan view, and the second dummy light conversion pattern has substantially a same shape as the second light conversion pattern when viewed in the plan view.

21. The display device of claim 16, wherein each of the first pixel areas, the second pixel areas, and the third pixel areas are arranged in a second direction substantially perpendicular to the first direction.

22. The display device of claim 1, further comprising:

an encapsulation layer covering the light emitting elements;

a base substrate disposed on the color filter layer; and a filling member disposed between the encapsulation layer and the light control pattern.

23. The display device of claim 22, further comprising:

a low refractive index layer disposed between the light control pattern and the color filter layer;

a first capping layer disposed between the filling member and the light control pattern; and a second capping layer disposed between the light control pattern and the low refractive index layer.

24. The display device of claim 1, further comprising:

an encapsulation layer covering the light emitting elements, wherein the light control pattern is disposed directly on the encapsulation layer.

25. The display device of claim 24, further comprising:

a low refractive index layer disposed between the light control pattern and the color filter layer;

a first capping layer disposed between the light control pattern and the low refractive index layer; and a second capping layer disposed between the low refractive index layer and the color filter layer.

26. The display device of claim 1, wherein a width in the first direction of the first opening is equal to or greater than a width in the first direction of the first pixel area when viewed in a cross-section.

27. The display device of claim 1, wherein the first quantum dot converts the source light into a first color light, the second quantum dot converts the source light into a second color light, the source light has a wavelength shorter than a wavelength of the first color light and a wavelength of the second color light, and the wavelength of the first color light is different from the wavelength of the second color light.

28. The display device of claim 1, wherein the light control pattern overlaps a portion of the light blocking area except for the portion of the light blocking area and the another portion of the light blocking area.

29. An electronic device comprising:

light emitting elements, wherein each of the light emitting elements emits a source light;

a color filter layer comprising first, second, and third pixel areas respectively corresponding to the light emitting elements and arranged in a first direction, and a light blocking area surrounding the first, second, and third pixel areas;

a light control pattern overlapping the second pixel area, wherein a first opening is defined through the light control pattern to overlap the first pixel area and a portion of the light blocking area adjacent to the first pixel area, and a second opening is defined through the light control pattern to overlap the third pixel area and a portion of the light blocking area adjacent to the third pixel area;

a first light conversion pattern disposed in the first opening, wherein the first light conversion pattern comprises a first quantum dot; and a second light conversion pattern disposed in the second opening, wherein the second light conversion pattern comprises a second quantum dot, wherein the second pixel area overlaps at least one selected from the portion of the light blocking area adjacent to the first pixel area and the portion of the light blocking area adjacent to the third pixel area in a second direction perpendicular to the first direction.

30. The electronic device of claim 29, wherein the light control pattern comprises a photosensitive resin.

* * * * *